US009621151B2

(12) United States Patent
Kanda et al.

(10) Patent No.: US 9,621,151 B2
(45) Date of Patent: Apr. 11, 2017

(54) SEMICONDUCTOR DEVICE AND ELECTRIC POWER CONTROL APPARATUS

(71) Applicant: RENESAS ELECTRONICS CORPORATION, Tokyo (JP)

(72) Inventors: Ryo Kanda, Tokyo (JP); Koichi Yamazaki, Tokyo (JP); Hiroshi Kuroiwa, Tokyo (JP); Masatoshi Maeda, Tokyo (JP); Tetsu Toda, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 15/157,040

(22) Filed: May 17, 2016

(65) Prior Publication Data
US 2017/0019093 A1 Jan. 19, 2017

(30) Foreign Application Priority Data
Jul. 15, 2015 (JP) ................... 2015-141219

(51) Int. Cl.
*H03K 3/00* (2006.01)
*H03K 17/082* (2006.01)
*H03K 3/356* (2006.01)
*H03K 5/01* (2006.01)
*H03K 5/24* (2006.01)
*H03K 17/567* (2006.01)
*H01L 23/528* (2006.01)
*H01L 23/00* (2006.01)

(52) U.S. Cl.
CPC ......... *H03K 17/0822* (2013.01); *H03K 3/356* (2013.01); *H03K 5/01* (2013.01); *H03K 5/24* (2013.01); *H03K 17/567* (2013.01); *H01L 23/528* (2013.01); *H01L 24/49* (2013.01)

(58) Field of Classification Search
CPC .... H03K 17/0822; H03K 5/24; H03K 17/567; H03K 5/01; H03K 3/356; H01L 23/528; H01L 24/49
See application file for complete search history.

(56) References Cited

U.S. PATENT DOCUMENTS 9,112,344 B2    8/2015  Fukuta et al.
2016/0056818 A1*  2/2016  Kanda ............... H03K 17/6872
                                                     318/504

FOREIGN PATENT DOCUMENTS

JP        2013-198185 A       9/2013

* cited by examiner

Primary Examiner — Kenneth B Wells
(74) Attorney, Agent, or Firm — McDermott Will & Emery LLP

(57) ABSTRACT

A driver IC includes a ring-shaped termination area, and a first area and a second area that are respectively arranged outside and inside the termination area on a layout. A sense MOS that is arranged between floating terminal and a first sense node and is driven at a power supply voltage is formed in the termination area. A fault detection circuit that detects presence of a fault when a voltage of the first sense node is higher than a decision voltage that has been deteLutined in advance in a period of time that a low side driver is driving a low side transistor into an ON state is formed in the first area.

17 Claims, 18 Drawing Sheets

SEMICONDUCTOR DEVICE AND ELECTRIC POWER CONTROL APPARATUS

CROSS-REFERENCE TO RELATED APPLICATIONS

The disclosure of Japanese Patent Application No. 2015-141219 filed on Jul. 15, 2015 including the specification, drawings and abstract is incorporated herein by reference in its entirety.

BACKGROUND

The present invention relates to a semiconductor device and an electric power control apparatus and, in particular, relates to the semicondcutor device and the electric power control apparatus, for example, used in the field of power electronics.

For example, in Japanese Unexamined Patent Application Publication No. 2013-198185, a configuration that a terminal of a drive IC is coupled to a collector of an external switching element via externally attached resistive element and diode is coupled to an emitter of the switching element via an externally attached capacitor is disclosed. The drive IC detects overcurrent of the switching element on the basis of a voltageVdesat of the terminal.

SUMMARY

For example, a driver IC (Integrated Circuit) or the like that drives a half bridge circuit and so forth has a function of detecting the overcurrent when the overcurrent has occurred in the half bridge circuit. As one of systems for implementing the above-mentioned function, a system of indirectly detecting the overcurrent by monitoring an emitter-to-collector voltage of the switching element (for example, an IGBT (Insulated Gate Bipolar Transistor) is known as described in Japanese Unexamined Patent Application Publication No. 2013-198185.

However, in the above-mentioned system,in general, it is requested to provide diodes and so forth that are designed for high voltage resistance and are to be used as components to be externally attached to the driver IC and it is also requested to provide a terminal (a terminal for the Voltage Vdesat) for overcurrent detection on the driver IC as described in Japanese Unexamined Patent Application Publication No. 2013-198185. Consequently, increasing in size and cost of the device including the driver IC concerned and so forth would occur.

Embodiments of the present invention that will be described later have been made in view of the above-mentioned circumstances. Other subjects and novel features of the present invention will become apparent from the description of the present specification and the appended drawings.

A semiconductor device according to one embodiment. is configured by one semiconductor chip and includes a floating terminal to be coupled to a floating voltage source, a termination area having a ring-like shape, a first area that is provided outside the termination area and a second area that is provided inside the termination area. A first transistor that is arranged between the floating terminal and a first sense node and is driven at a first power supply voltage is formed in the termination area. A low side driver that drives an external low side transistor and a fault detection circuit are formed in the first area. The fault detection circuit detects presence of a fault when a voltage of the first sense node is higher than a first decision voltage that has been determined in advance in a period of time that the low side driver s driving the low side transistor into an ON state.

According to the above-mentioned one embodiment it becomes possible to implement miniaturization and so forth of the electric power control apparatus that includes the semiconductor device such as the driver IC and so forth.

DETAILED DESCRIPTION

Although, in the following embodiments, description will be made by dividing into a plurality of sections or embodiments when necessary for the convenience sake, these are not unrelated to each another and these are related to each other such that one covers some or all of modified examples, detailed explanation, supplemental explanation and so forth of the other unless otherwise clearly stated. In addition, in the following embodiments, in a case where a number of constitutional elements and so forth (a number of units, a numerical value, an amount/a quantity, a range and so forth are included) is referred to, it is not limited to the specific number and may be at least and/or not more than the specific number unless otherwise clearly stated in particular and unless otherwise definitely limited to the specific number in principle.

In addition, in the following embodiments, it goes without saying that the constitutional elements (element steps and so forth are also included) are not necessarily indispensable unless otherwise clearly stated and unless otherwise thought to be clearly indispensable in principle. Likewise, in the following embodiments, when the shapes of the constitutional elements and so forth, a positional relationship among them and so forth are referred to, the ones that are substantially approximate or similar to the shapes and so forth will be included unless otherwise clearly stated and unless otherwise clearly thought that it is not so in principae. The same also applies to the above-mentioned numerical values and ranges.

In addition, although in the embodiments, a MOSFET (Metal Oxide Semiconductor Field Effect Transistor) (abbreviated as a MOS transistor) is used as one example of a MISFET (Metal Insulator Semiconductor Field Effect Transistor, a non-oxide film is not excluded as a gate insulation film. Further, in the embodiments, an n channel type MOSFET will be referred to as an NMOS transistor and a p channel type MOSFET will be referred to as a PMOS transistor.

In the following, preferred embodiments of the present invention will be described in detail on the basis of the drawings. Incidentally, in all of the drawings used in order to describe the embodiments of the present. invention, the same numerals are assigned to the same members in principle and repetitive description thereon is omitted.

First Embodiment
(General Configuration and General Operation of a Driver IC)

Figure 1:
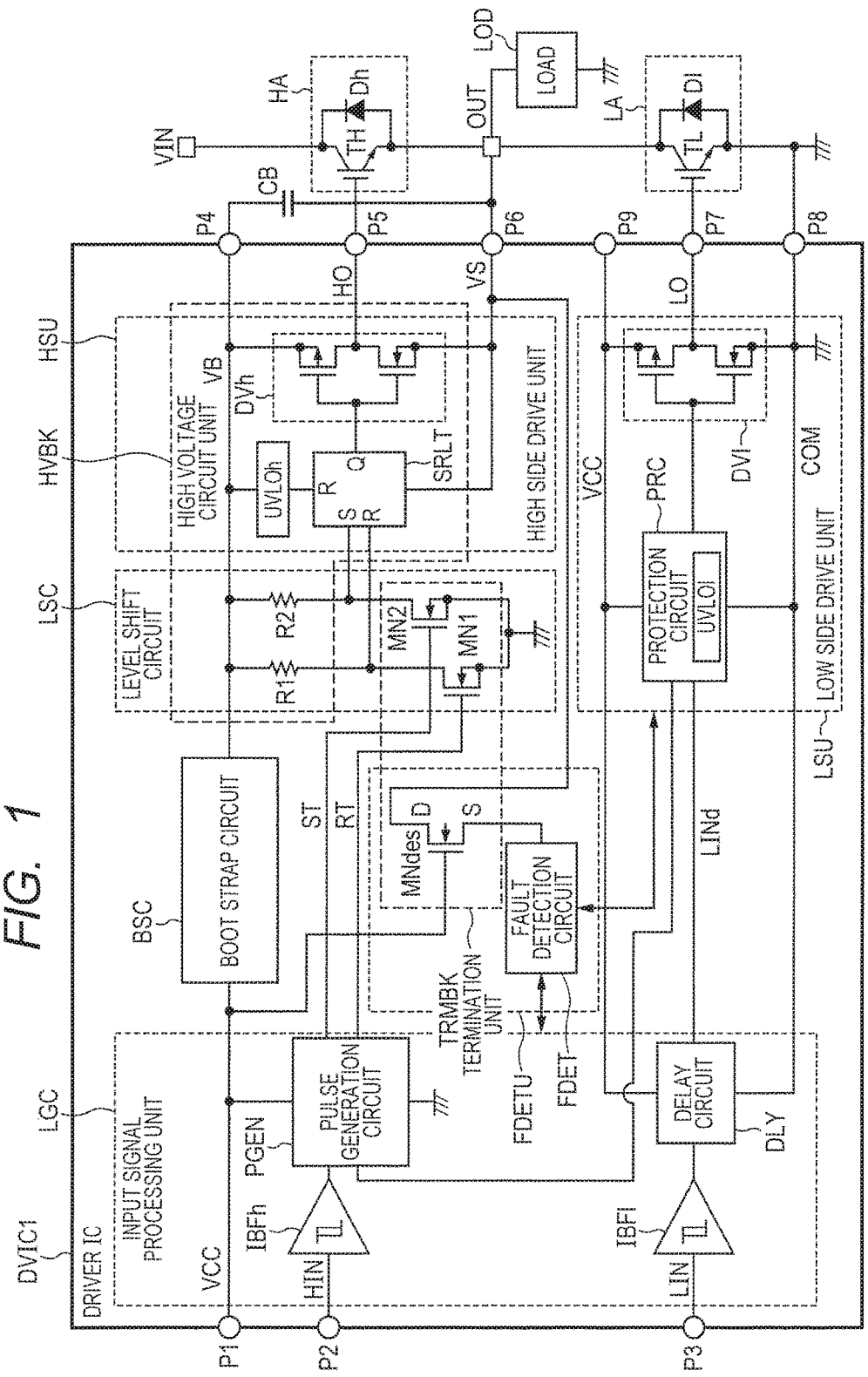
FIG. 1 is a block diagram illustrating one rough configurational example of a semiconductor device according to a first embodiment of the present invention.

FIG. 1 is a circuit block diagram illustrating one rough configurational example of a semiconductor device according to the first embodiment of the present invention. A driver IC (the semiconductor device) DVIC1 illustrated in FIG. 1 is configured by one semiconductor chip and includes a plurality of pads P1 to P9, an input signal processing unit LGC, a bootstrap circuit BSC, a level shift circuit LSC, a high side drive unit HSU, a low side drive unit LSU, a fault detection unit FDETU and so forth. In addition, here, one configurational example of an electric power control apparatus that includes a high side arm HA, a low side arm LA and a bootstrap capacitor CB to be installed outside the driver IC (DVICI) and one configurational example of an electronic system that further includes a load circuit LOD are illustrated in addition to one configurational example of the driver IC (DVICI).

The pad (a power supply terminal) P1 is coupled to a power supply voltage VCC source of, for example, about 15V. A high side input signal HIN is input into the pad P2 and a low side input signal LIN is input into the pad P3. The high side input signal HIN and the low side input signal LIN are generated by, for example, a not illustrated microcomputer (MCU: Micro Control Unit) and so forth.

The pad (the power supply terminal) P4 is coupled to a boot power supply voltage VB source. The pad (a load drive teraldnal or a floating terminal) P6 is coupled to a floating voltage VS source and is also coupled to the load circuit LOD via a load drive terminal OUT. A high side output signal HO is output to the pad P5 The pad P9 is coupled to the power supply voltage VCC source and the pad (a reference terminal) P8 is coupled to a reference voltage COM source of about 0 V. A low side output signal LO is output to the pad P7. Incidentally, the pad P9 may be integrated with the pad P1.

Here, the high side arm HA is arranged between a power supply terminal to be coupled to an input power supply voltage VIN source and the pad R6 and is ON/OFF controlled with the high side output signal HO. Specifically, the high side arm HA includes a high side transistor TH, a reflux diode Dh and so forth and the high side transistor TH is driven with the high side output signal HO. The input power supply voltage VIN has a voltage value of, for example, at least about 150 V and desirably has voltage value (for example, about 600 V) of at least about 300 V on the basis of the 0-V reference voltage COM. The bootstrap capacitor CB is arranged between the pad P4 and the pad P6.

The low side arm LA is arranged between the pad P6 and the pad P8 and is ON/OFF controlled with the low side output signal LO. Specifically, the low side arm LA includes a low side transistor TL, a reflux diode D1 and so forth and the low side transistor TL is driven with the low side output signal LO. The floating voltage VS of the pad (the load drive terminal) P6 shifts between a value that is almost equivalent to about 0 V and a value that is almost equivalent to the value of the input power supply voltage VIN in accordance with the ON and OFF states of the nigh side arm HA and the low side arm LA. More strictly describing, there are also cases where the floating voltage VS temporarily shifts within a range that is wider than the range from about 0 V to the input power supply voltage VIN in accordance with a reverse voltage of the load circuit LOD.

Therefore, the high side transistor TH and the low side transistor TL each is configured by the IGBT representatively and by high voltage resistance elements such as a high voltage resistance MOSFET, a high voltage resistance bipolar transistor and so forth in some cases. In addition, the boot power supply voltage VS of the pad P4 is controlled to shift so as to follow the floating voltage VS of the pad P6 by the bootstrap capacitor CB.

The input signal processing unit LGC includes a high side input buffer IBFh, a low side input buffer IBFl, a pulse generation circuit PGEN, a delay circuit DLY and so forth. The high side input buffer IBFh converts the high side input signal HIN that has been input into the pad 2 into signal of a voltage level equivalent to the power supply voltage VCC and outputs the converted signal to the pulse generation circuit PGEN. The low side input buffer IBFl converts the low side input signal LIN that has been input into the pad P3 into a signal of a voltage level equivalent to the power supply voltage VCC and outputs the converted signal to the delay circuit DLY. The input buffers IBFh and IBFl each is configured by, for example, a Schmitt trigger circuit and so forth in order to remove input noise.

The pulse generation circuit PGEN and the delay circuit DLY operate at the power supply voltage VCC on the basis of the reference voltage. The pulse generation circuit PGEN receives an output signal from the high side input buffer IBGh, generates a set signal ST at one of its rising edge and falling edge and, on the other hand, generates a reset signal RT. The set signal and the reset signal each is, for example, a one-shot pulse signal. The delay circuit DLY adds a delay (a so-called dead time) to an output signal from the low side input buffer IBFl so as to avoid simultaneous driving of the high side transistor TH and the low side transistor TL into the ON states and outputs a delayed low side input signal LINd.

The high aide drive unit HSU includes a high side driver DVh, an SR latch circuit SRLT, a high side low voltage detection circuit UVLOh and so forth and these constitutional elements operate at the boot powder supply voltage VB the source of which is coupled to the pad P4 on the basis of the floating voltage VS the source of which is coupled to the pad P6. The high side driver DVh is configured by, for example, a CMOS inverter or the like that receives an output signal (Q) from the SR latch circuit SRLT as an input and drives the high side transistor TH by outputting the high side output signal HO to the pad PS.

The SR latch circuit SRLT controls the high side output signal HO via the high side driver DVh in accordance with set input (S) and reset input (R). Specifically, the SR latch circuit SRLT controls the level of the high side output signal HO to the boot power supply voltage VB level in accordance with the set input (S) and controls the level of the high side output signal HO to the floating voltage VS level in accordance with the reset input (R). When the value of the boot power supply voltage VB that has been obtained on the basis of the floating voltage VS does not reach a predetermined voltage value, the high side low voltage detection circuit UVLOh performs the reset input (R) on the SR latch circuit SRLT. Consequently, the high side transistor TH is fixed to the OFF state until the value of the boot power supply voltage VB reaches the predete mined voltage value.

The level shift circuit LSC includes two NMOS transistors MN1 and MN2, two resistors R1 and R2 and so forth. In the present embodiment, the NMOS transistors MN1 and MN2 each will be referred to as a level shift MOS. In the level shift MOS (MN1), a source is coupled to the reference voltage COM source and a drain is coupled to the pad P4 via the resistor R1. In the level shift MOS (MN2), a source is coupled to the reference voltage COM source and a drain is coupled to the pad P4 via the resistor R2. Since the boot power supply voltage VB is applied between the source and the drain of each of the level. shift MOSs (MN1 and MN2) on the basis of the reference voltage COM in this way, it is requested to configure the level shift MOS (MN1 and MN2) by the high voltage resistance elements.

The level shift MOS (MN2) converts the voltage level of the set signal ST to a voltage level that conforms to the set input (S) of the SR latch circuit SRLT by making a predetermined pulse current flow into the resistor R2 in accordance with the set signal ST. Likewise, the level shift MOS (MN1) converts the voltage level of the reset signal RT to a voltage level that conforms to the reset input (R) of the SR latch circuit SRLT by making the predetermined pulse current flow into the resistor R1 in accordance with the reset signal RT. The level shift circuit LSC assumes a function of converting the signal that is based on the reference voltage COM into the signal that is based on the floating voltage VS in this way.

The low side drive unit LSU includes a low side driver DVl, a protection circuit PRC that includes a low side low voltage detection circuit UVLO1 and so forth and these constitutional elements operate at the power supply voltage VCC on the basis of the reference voltage COM. The low side driver DVl is configured by, for example, a CMOS inverter or the like that receives an output signal from the protection circuit PR as an input and drives the low side transistor TL by outputting the low side output signal LO to the pad P7.

When the voltage value of the power supply voltage VCC that has been set on the basis of the reference voltage COM does not reach the predetermined voltage value, the low side low voltage detection circuit UVLO1 controls the level of the low side output signal LO to the reference voltage COM level via the low side driver DVl. Consequently, the low side transistor TL is fixed to the OFF state until the value of the power supply voltage VCC reaches the predetermined voltage value. In addition, when the value of the power supply voltage VCC does not reach the predetermined voltage value, the low side low voltage detection circuit UVLO1 gives notice of this fact to the pulse generation circuit PGEN. The pulse generation circuit PGEN receives the notice and stops at least generation of the set signal ST. Consequently, also the high side transistor TH is fixed to the OFF state until the value of the power supply voltage VCC reaches the predetermined voltage value.

Incidentally, the protection circuit PRC performs various protecting operations on the low side transistor TL including such a protecting operation performed using the low side low voltage detection circuit UVLO1 as mentioned above. When there ae no particular abnormalities, such as, for example, when the value of the power supply voltage VCC reaches the predetermined voltage value and so forth, the protection circuit PRC outputs the output signal from the delay circuit DLY toward the low side driver DVl.

The bootstrap circuit BSC appropriately charges the bootstrap capacitor CB such that the voltage (that is, the voltage of the pad P4 to be set on the basis of the voltage of the pad PC) of the bootstrap capacitor CB is maintained at the power supply voltage VCC. Specifically, when the boot power supply voltage VB is lower than the power supply voltage VCC, the bootstrap circuit BSC couples the pad P1 to the pad P4, while when the boot power supply voltage VB is higher than the power supply voltage VCC, decouples the pad P1 from the pad P4. Consequently, the bootstrap capacitor CB is charged to the level of the power supply voltage VCC in a period of time that the low side transistor TL is in the ON state (that is, the pad P6 is maintained at the reference voltage COM level) and supplies the charged power supply voltage VCC to the high side driver DVh and so forth in a period of time that the high side transistor TH is in the ON state.

The fault detection unit FDETU includes a sensing NMOS transistor MNdes, a fault detection circuit FDET and so forth. In the following, in the present embodiment, the NMOS transistor MNdes will be referred to as a sense MOS. In the sense MOS (MNdes), a source-drain path is provided between the pad (the floating terminal or the load drive terminal) P6 and an input node (a sense node) into the fault detection circuit FDET and a gate is driven at the power supply voltage VCC. The fault detection circuit FDET detects presence/absence of various faults on the basis of the voltage of the sense node. Incidentally, details of the fault detection unit FDETU will be described later.

Figure 2:
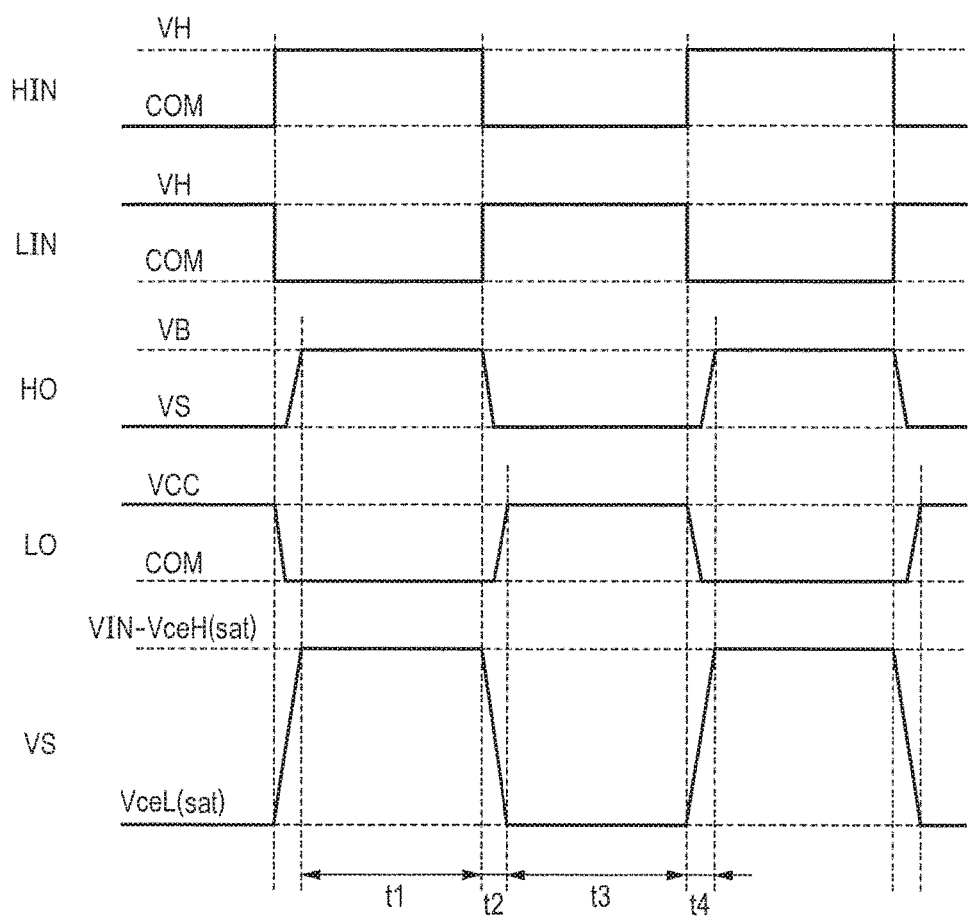
FIG. 2 is a waveform diagram illustrating one example of general inputting/outputting operations in the semiconductor device in FIG. 1.

FIG. 2 is a waveform diagram illustrating one example of rough inputting/outputting operations in the semiconductor device in FIG. 1. Here, a case where the high side input signal HIN and the low side input signal LIN have been complementally input is assumed. The high side input signal HIN and the low side input signal LIN shift, for example, with the reference voltage COM being set as a 'L' level and with the high potential side voltage VH (for example, about 5 V) being set as a 'H' level.

The driver IC (the semiconductor device) DVICI corrplementally outputs the high side output signal HO and the low side output signal LO in accordance with the input concerned. The high side output signal HO shifts, for example, with the floating voltage VS being set as the 'L' level and with the boot power supply voltage VB being set as the 'H' level. The low side output signal LO shifts, for example, with the reference voltage COM (about 0 V) being as the 'L' level and with the power supply voltage VCC being as the 'H' level. Incidentally, when shifting the high side output signal HO and the low side output signal LO, a dead time is appropriately added such that a time period that both of the signals are simultaneously turned on is not generated.

Here, in a time period (t1) that the high side output signal HO shifts to the 'H' level (an ON level) and the low side output signal shifts to the 'L' level (an OFF level), the floating voltage VS reaches "VIN—VceH (sat)". The input power supply voltage VIN is, for example, about 600 V. VceH (sat) is an emitter-to-collector ON voltage of the high side transistor TH and exhibits a low value of, for example, about 5V in the IGBT. On the other hand, in a time period (t3) that the high side output signal HO shifts to the 'L' level (the OFF level) and the low side output signal LO shifts to the 'H' level (the ON level), the floating voltage VS reaches "VceL (sat)". VceL (sat) is the ON voltage (for example, about 1.5 V) in the low side transistor TL.

In addition, in a time period (t2) that the high side output signal HO shifts to the 'L' level (the OFF level) and the low side output signal LO shifts to the 'H' level (the ON level), the floating voltage VS is lowered from "VIN-VceH (sat)" toward "VceL (sat)". Describing in detail, when the high side transistor TH shifts to the OFF state, for example, a reflux current flows into the low side reflux diode Dl arid the floating voltage VS is lowered toward a voltage value that has been lowered from the reference voltage COM by a voltage drop of the reflux diode Dl in accordance with flowing of the reflux current. Then, when the low side transistor TL shifts to the ON state, the floating voltage VS reaches "VceL (sat)".

Likewise, in a time period (t4) that the low side output signal LO shifts to the 'L' level (the OFF level) and the high side output signal HO shifts to the 'H' level (the ON level), the floating voltage VS is raised from "VceL (sat)" toward "VIN-VceH (sat)". Describing in detail, when the low side transistor TL shifts to the OFF state, for example, the reflux current flows into the high side reflux diode Dh and the floating voltage VS is raised toward a voltage value that has been raised from the input power supply voltage VIN by a voltage drop of the reflux diode Dh in accordance with flowing of the reflux current. Then, when the high side transistor TH shifts to the ON state, the floating voltage VS reaches "VIN—VceH (sat)".

(One Example of Drawbacks of the Driver IC)

Figure 18A:
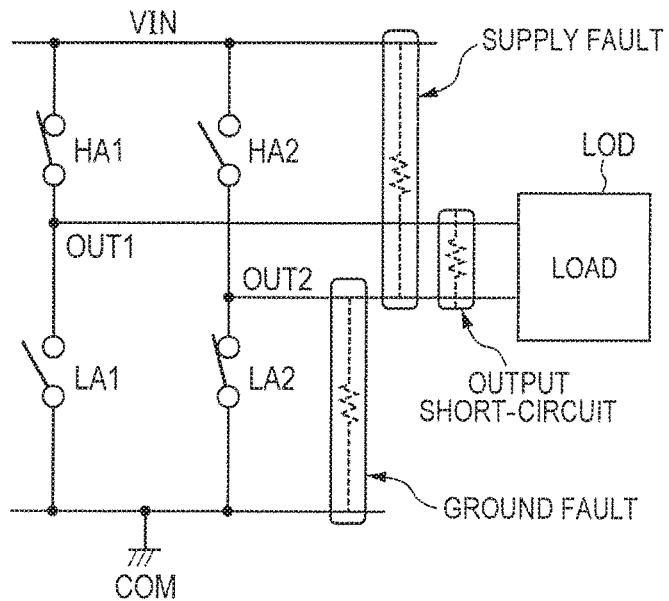
FIG. 18A is an explanatory diagram illustrating one example of faults which would occur in a high side arm and a low side arm.
Figure 18B:
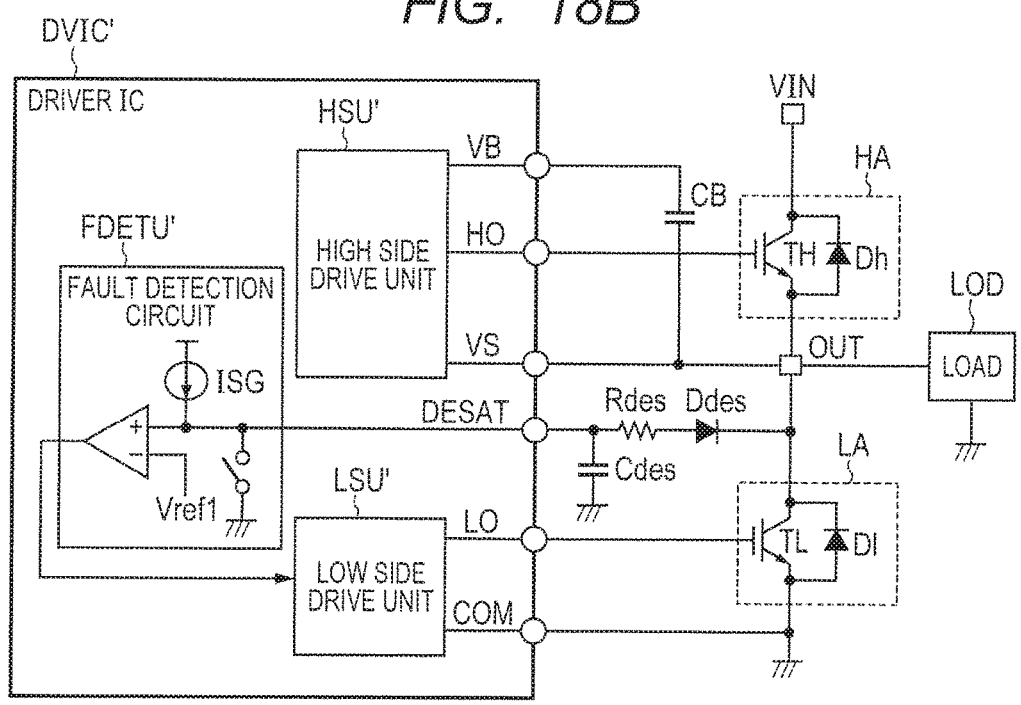
FIG. 18B is a schematic diagram illustrating one example of a fault detection system in a semiconductor device that has been discussed as a comparative example of the device according to the present invention.

FIG. 18A is an explanatory diagram illustrating one example of faults that would occur in the high side arm and the low side arm and FIG. 18B is a schematic diagram illustrating one example of a fault detection system in a semiconductor device that has been discussed as a comparative example of the present invention. In FIG. 18A, one configurational example of a case where the load circuit LOD is driven by using two-phase load drive terminals OUT1 and OUT2 in an H bridge circuit as one example. The load drive terminal OUT1 is driven by a high side arm HA1 and a low side arm LA1 and the load drive terminal OUT2 is driven by a high side arm HA2 and a low side arm LA2.

As representative faults that would occur in such a circuit as mentioned above, an output short circuit, a supply fault and a ground fault are known. The output short circuit is a fault that the short circuit occurs between the two-phase load drive terminals OUT1 and OUT2 at a low resistance. The supply fault is a fault that the short circuit occurs between the load drive terminal (for example, OUT2) and the input power supply voltage VIN source at the low resistance and the ground fault is a fault that the short circuit occurs between the load drive terminal (for example, OUT2) and the reference voltage COM source at the low resistance.

Here, it is conceivable to use, for example, a configuration as illustrated in FIG. 18B as a circuit for detecting the output short circuit. A driver IC (DVIC') illustrated in FIG. 18B includes a detection terminal DESAT and a fault detection unit FDETU'. The detection terminal DESAT is coupled to a collector of the IGBT that configures the low side arm LA via a resistor Rdes and a diode Ddes that are prepared as externally attached components of the driver IC (DVIC') and is coupled to the reference voltage COM source via a capacitor Cdes that is prepared as an externally attached component of the driver IC (DVIC').

For example, as illustrated in FIG. 18A, when the high side arm HA1 and the low side arm LA2 are in the ON states and no output short circuit occurs, the voltage of the load drive teLminal OUT2 is maintained at a value of a general ON voltage (for example, about 1.5 V) in the low side transistor TL. On the other hand, when the output short circuit is occurring, the voltage of the load drive terminal OUT2 reaches a high value that is, for example, in excess of about 7.0 V in association with flowing of overcurrent between the emitter and the collector of the low side transistor TL.

Thus, when the capacitor Cdes has been discharged and the low side transistor TL has been turned on, for example, in a time period that the low side transistor TL is in the OFF state, the fault detection unit FEDETU' charges the capacitor Cdes using a fine current from a current source ISG. On that occasion, when an overvoltage is generated in the collector of the low side transistor TL, charging of the capacitor Cdes is progressed by reverse biasing of the diode Ddes, while when the overvoltage is not generated, charging of the capacitor Cdes is not progressed by forward biasing of the diode Ddes. After a predetermined charging time period has elapsed, when the voltage of the detection terminal DESAT exceeds a predetermined decision voltage Vref1 (for example, about 7.0 V), the fault detection unit FDETU' detects presence of the fault, while when the voltage of the detection terminal DESAT does not exceed the predetermined decision voltage Vref1, the fault detection unit FDETU' detects absence of the fault.

However, in such a configuration as illustrated in FIG. 18B, it is requested to provide the detection terminal DESAT on the driver IC (DVIC') and it may be also necessary to mount the various externally attached components (Ddes, Rdes, Cdes and so forth) onto the outer side of the driver IC. Consequently, the size of the electric power control apparatus configured by the driver IC (DVIC') concerned and the externally attached components of the driver IC is increased and various costs such as a cost for the components, a cost for implementation and so forth may be increased.

On the other hand, it is also conceivable to integrate such various externally attached components into the driver IC (DVIC'). However, since in particular, in the diode Ddes, the floating voltage VS shifts with an amplitude that is almost equivalent to that of the input power supply voltage VIN (for example, about 600 V), it may be necessary to design the diode Ddes for high voltage resistance. When such a p-n junction diode designed for high voltage resistance has been integrated into the driver IC (DVIC') it is feared that a circuit area may be greatly increased. In addition, it is also feared that the power consumption may be increased in association with generation of parasitic currents of the p-n junction. Thus, it becomes beneficial to use the fault detection unit according to the first embodiment.

(Details of the Fault Detection Unit)

Figure 3A:
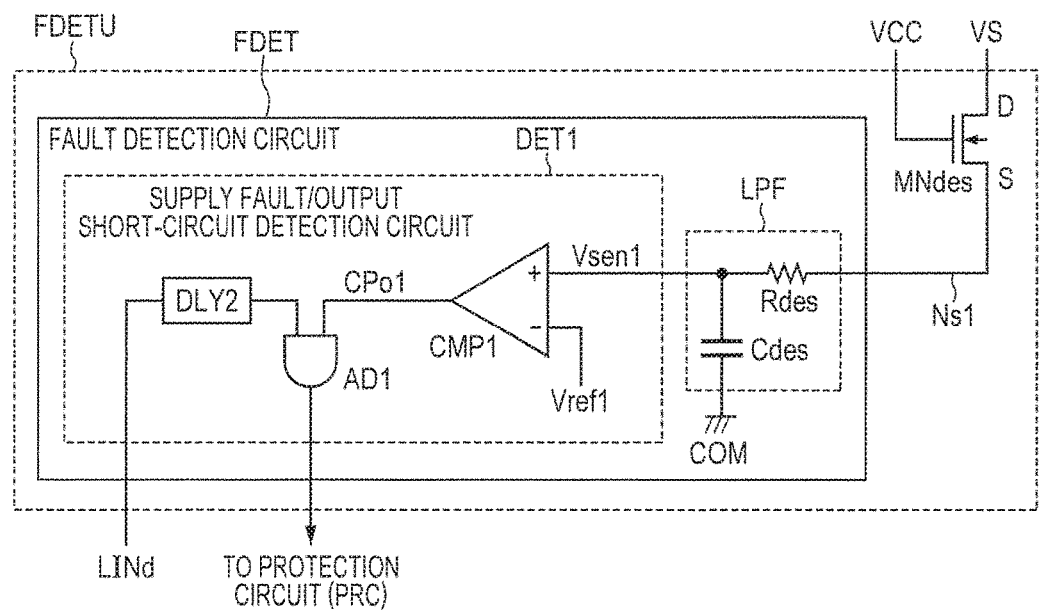
FIG. 3A is a circuit diagram illustrating one configurational example of a fault detection unit in FIG. 1.
Figure 3B:
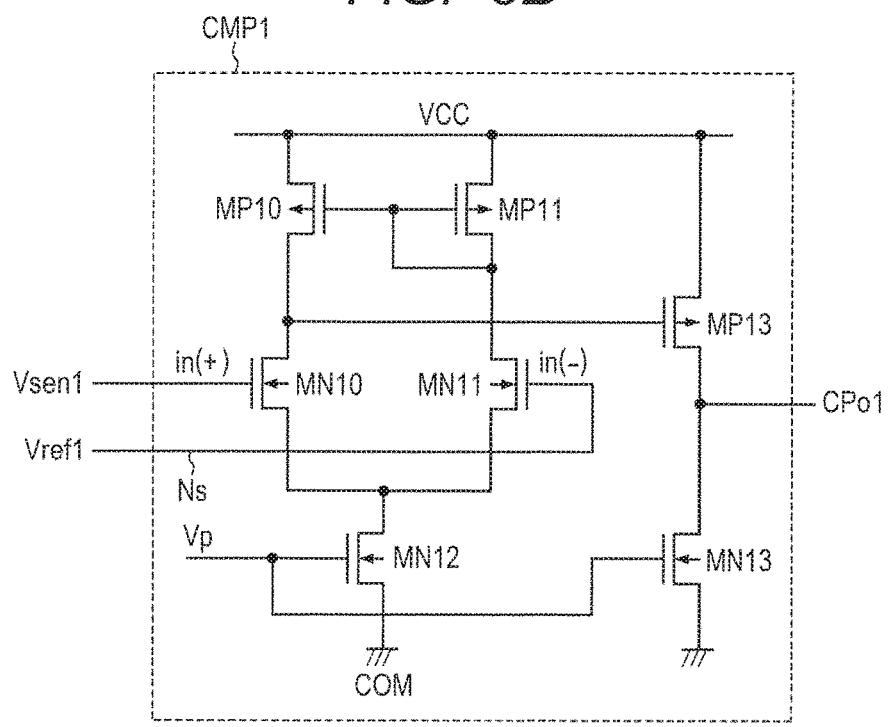
FIG. 3B is a circuit diagram illustrating one configurational example of a comparator circuit in FIG. 3A.

FIG. 3A is a circuit diagram illustrating one configurational example of the fault detection unit in FIG. 1. FIG. 3B is a circuit diagram illustrating one configurational example of a comparator circuit in FIG. 3A. The fault detection unit DETU illustrated in FIG. 3A includes the above-mentioned sense MOS (the NMOS transistor) MNdes, the fault detection circuit FDET and so forth. In the sense MOS (MNdes), a drain (D) is coupled to the floating voltage VS source (the pad P6), a source (S) is coupled to a sense node Ns1 and a gate is coupled to the power supply voltage VCC source (the pad P1). The sense MOS (MNdes) is provided in place of the diode Ddes illustrated in FIG. 18B.

The sense MOS (MNDes) is configured by, for example, a depression type transistor. In this case, it is possible for the sense MOS (MNdes) to transmit the floating voltage VS to the sense node Ns1 until the floating voltage VS exceeds "VCC (the power supply voltage (for example, about 15 V))+Vsup", with a step-up voltage (that is, a threshold voltage) in association with use of the depression type transistor being designated by Vsup. In other words, when the floating voltage VS is lower than "VCC (the power supply voltage)+Vsup (the step-up voltage)", a voltage (eventually, a sense voltage Vsen1) of the sense node Ns1 becomes equal to the floating voltage VS. On the other hand, when the floating voltage VS exceeds "VCC (the power supply voltage)+Vsup (the step-up voltage)", the sense MOS (MNdes) clamps the voltage (the sense voltage Vsen1) of the sense node Ns1 to "VCC (the power supply voltage)+Vsup (the step-up voltage)".

The fault detection circuit FDET includes a filter circuit LPF that includes the resistor Rdes and the capacitor Cdes, a supply fault/output short circuit detection circuit DET1 and so forth. The filter circuit LPF serves to smooth out the voltage of the sense node Ns1 and, for example, even when a surge voltage and so forth have been generated in the floating voltage VS, to protect the supply fault/output short circuit detection circuit DET1 against the surge voltage concerned and so forth.

The supply fault/output short circuit detection circuit DET1 includes a comparator circuit CMP1 and also includes, for example, a delay circuit DLY2, an AND operation circuit AD1 and so forth in addition to the comparator circuit CMP1. The comparator circuit CMP1 compares the sense voltage Vsen1 to be output as an output voltage of the filter circuit LPF with the decision voltage (for example, about 7.0 V) that has been determined in advance and outputs an output signal CPo1 according to a result of comparison. Here, the output signal CPo1 shifts to the 'H' level when Vsen1 >Vref1 and shifts to the 'L' level when Vsen1<Vref1.

The delay circuit DLY2 delays, for example, the delayed low side input signal LINd illustrated. in FIG. 1. The delay circuit DLY2 ensures a time period taken until the low side transistor TL is actually turned on after the low side input signal LIN has shifted to the 'H' level. The AND operation circuit AD1 outputs the 'H' level indicative of presence of the fault toward, for example, the protection circuit PRC in FIG. when both of the output signal from the delay circuit DLY2 and the output signal CPo1 from the comparator circuit CMP1 are at the 'H' levels.

The fault concerned corresponds to the output short circuit, the supply fault or the like illustrated in FIG. 18A. In case of the supply fault, the overvoltage may generate in the floating voltage VS (the load drive terminal OUT2 in FIG. 18A) irrespective of turning-on of the low side transistor TL (the low side arm LA2 in FIG. 18A) similarly to the case of the output short circuit described in FIG. 18A.

The supply fault/output short circuit detection circuit DET1 detects presence of the fault when the sense voltage Vseni is higher than the decision voltage Vref1 in the time period that the low side driver DV1 is driving the low side transistor TL to the ON state in this way. When presence of the fault has been detected, the protection circuit PRO turns the low side transistor TL off to reduce the speed to some extent, for example, so as to avoid sudden breakage of the current (in order to prevent voltage jumping which would occur in association with sudden breakage of the current).

As described above, it becomes possible to eliminate provision of such detection terminal DESAT and various externally attached components (Ddes, Rdes, Cdes and so forth) as illustrated in FIG. 18B by using the driver IC (the semiconductor device) DVIC1 that includes the fault detection unit FDETU in FIG. 3A. Consequently, it becomes possible to implement miniaturization of the power apparatus that includes the semiconductor device concerned and it becomes also possible to implement reductions in various costs such as the component cost, the implementation cost and so forth. In particular, such advantageous effects are obtained by providing the sense MOS (MNdes) that is built into the semiconductorchip in place of the externally attached diode Odes in FIG. 18B. Although details of the sense MOS (MNdes) will be described later, it is possible to efficiently form the sense MOS (MNdes) in the semiconductor chip unlike the diode.

In addition, the operation performed when the sense MOS (MNdes) is used is slightly different from the operation perfosaued when the diode Odes in FIG. 18B is used. In the example in FIG. 18B, for example, in a case where the detection element DESAT is at about 0 V, when the floating voltage VS shifts to a positive voltage, the diode Ddes is reversely biased, and therefore it becomes difficult to transmit the floating voltage VS to the detection terminal DESAT. Accordingly, in the example in FIG. 18B, the system of indirectly detecting the floating voltage VS by charging the capacitor Cdes using the current source ISG is adopted.

On the other hand, in the system adopted in the first embodiment, the sense MOS (MNdes) that operates in the ON state is used. The sense MOS (Mndes) assumes a function of transmitting the floating voltage VS to the sense node Ns1 and, when the floating voltage VS is excessive (that is, the voltage VS exceeds "VCC (the power supply voltage)+Vsup (the step-up voltage"), clamping the floating voltage VS to "VCC (power supply voltage+Vsup (the step-up voltage)" and then transmitting the voltage so clamped to the sense node Ns1.

Accordingly, a is possible for the fault detection unit FDETU to directly detect the floating voltage VS within a range not exceeding "VCC (the power supply voltage)+ Vsup (the step-up voltage)" without using such a current source ISG and so forth as illustrated in FIG. 18B. Consequently, simplification and so forth of the circuit configuration of the fault detection unit FDETU become possible. Further, since a voltage that is, for example, as high as the level of the input power supply voltage VIN is not applied to the comparator circuit CMP1 by using the clamping function that is implemented by the sense MOS (MNdes), it is possible to configure the comparator circuit CMP1 by a low voltage resistance element.

The comparator circuit CMP1 illustrated in FIG. 3B operates at the power supply voltage VCC on the basis of the reference voltage COM and includes NMOS transistors MN10 to MN13, PMOS transistors MP10, MP11 and MP11 and so forth. The NMOS transistors MN10 to MN12 and the PMOS transistors MP10 and MP11 configure a differential amplification circuit and the NMOS transistor MN13 and the PMOS transistor MP13 configure a grounded source amplification circuit.

The NMOS transistors MN10 and MN11 have sources that are commonly coupled and serve as a differential input unit in the differential amplification circuit. The NMOS transistor MN12 functions as a tail current source of the differential amplification circuit by application of a fixed voltage Vp between a gate and a source thereof. The PMOS transistors MP10 and MP11 function as a load current source of the differential amplification circuit. The sense voltage Vsen1 is input into a gate of the NMOS transistor MN10 and the decision voltage Vref1 is input into a gate of the NMOS transistor MN11. Then, an output signal of the differential amplification circuit is generated from a drain of the NMOS transistor MN10.

The NMOS transistor MN13 functions as a load current source of the grounded source amplification circuit by application of the fixed voltage Vp between agate and a source thereof. The PMOS transistor MP13 receives an output signal from the differential amplification circuit, between the gate and the source thereof and generates the output signal CPo1 of the comparator circuit CMP1 from a drain thereof.

It is possible to configure the comparator circuit CMP1 by the voltage comparator circuit and so forth that operate at the power supply voltage VCC in this way. The respective MOS transistors (MN10 to MN13, MP10, MP11, and MP13) that configure the comparator circuit CMP1 each is configured by an enhancement type MOS transistor. Here, a difference between the enhancement type MOS transistor and the depression type MOS transistor will be described.

In the enhancement type MOS transistor, a channel is not formed when a gate-to-source voltage is about 0 V and the current does not substantially flow irrespective of presence of a difference in potential between the source and the drain. On the other hand, in the depression type MOS transistor, since the channel is formed in advance by doping a semiconductor surface directly under the gate, the current flows even when the gate-to-source voltage is about 0 V as long as there exists a difference in potential between the source and the drain.

(Characteristics of the Sense MOS)

Figure 4:
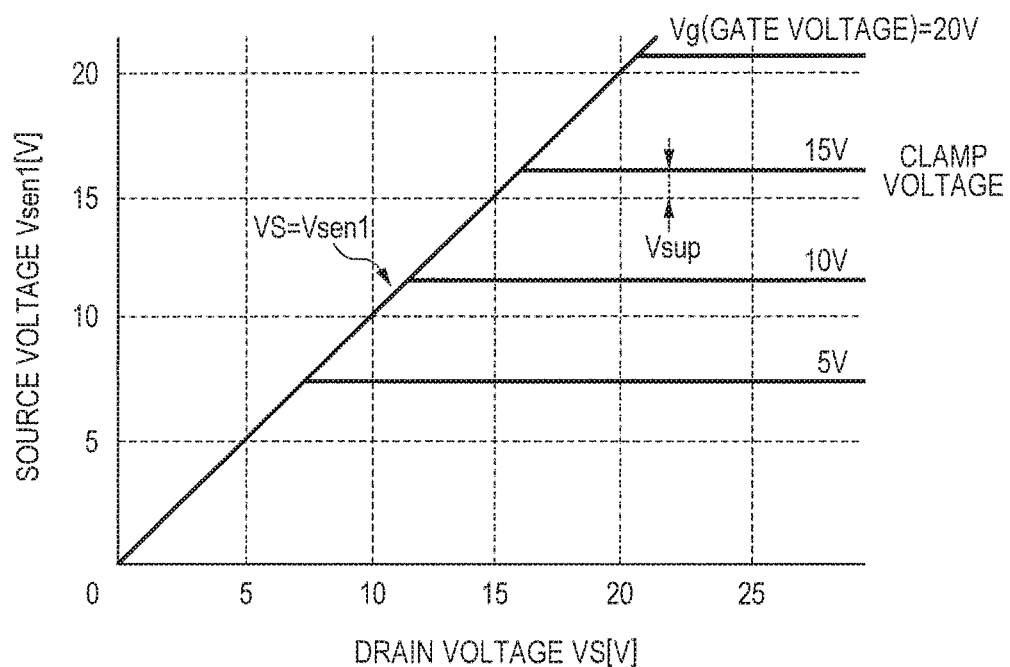
FIG. 4 is a diagram illustrating one example of electric characteristics of a sense MOS in the semiconductor device in FIG. 1.

FIG. 4 is a diagram illustrating one example of electrical characteristics of the sense MOS in the semiconductor device in FIG. 1. As illustrated in FIG. 4, within a range that the drain voltage (that is, the floating voltage VS) does not exceed "Vg (the gate voltage)+Vsup (the step-up voltage)", the depression type sense MOS (MNdes) has a characteristic of making the source voltage (that is, the sense voltage Vsen1) equal to the drain voltage (VS). On the other hand, within a range that the drain voltage (VS) exceeds "Vg (the gate voltage)+Vsup (the step-up voltage)", the depression type sense MOS (MNdes) has a characteristic clamping the source voltage (Vsen1) to "Vp (the gate voltage)+Vsup (the step-up voltage)".

Here, when the step-up voltage Vsup is increased (in other words, the threshold voltage is lowered), a maximum input voltage to be applied to the comparator circuit CMP1 is increased by that amount and therefore a margin of voltage resistance (for example, the voltage resistance of the gate of the NMOS transistor MN10) of the comparator circuit CMP1 is reduced. On the other hand, when the step-up voltage Vsup is reduce (the threshold voltage is raised), the sense MOS (MNdes) is liable to shift to the OFF state due to noise and so forth. Thus, it is desirable that the step-up voltage Vsup be set to become as large as possible within a range not exceeding the voltage resistance of the comparator circuit CMP1.

That is, since it becomes difficult for the sense MOS (MNdes) to appropriately control the source (S) voltage when the sense MOS shifts to the OFF state, ideally, it is desirable for the sense MOS (MNdes) to operate typically in the ON state. For this purpose, it is favorable to use the depression type configuration so as to make the step-up voltage Vsup as large as possible (to make the threshold voltage low) and thereby it becomes difficult the sense MOS (MNdes) to shift to the OFF state. From this viewpoint, it is beneficial to use the depression type configuration for the sense MOS (MNdes) instead of the enhancement type configuration. However, the sense MOS (MNdes) may not necessarily have the depression type configuration and it is also possible to use the enhancement type configuration as the case may be.

(Rough Layout Configuration of the Driver IC)

Figure 5:
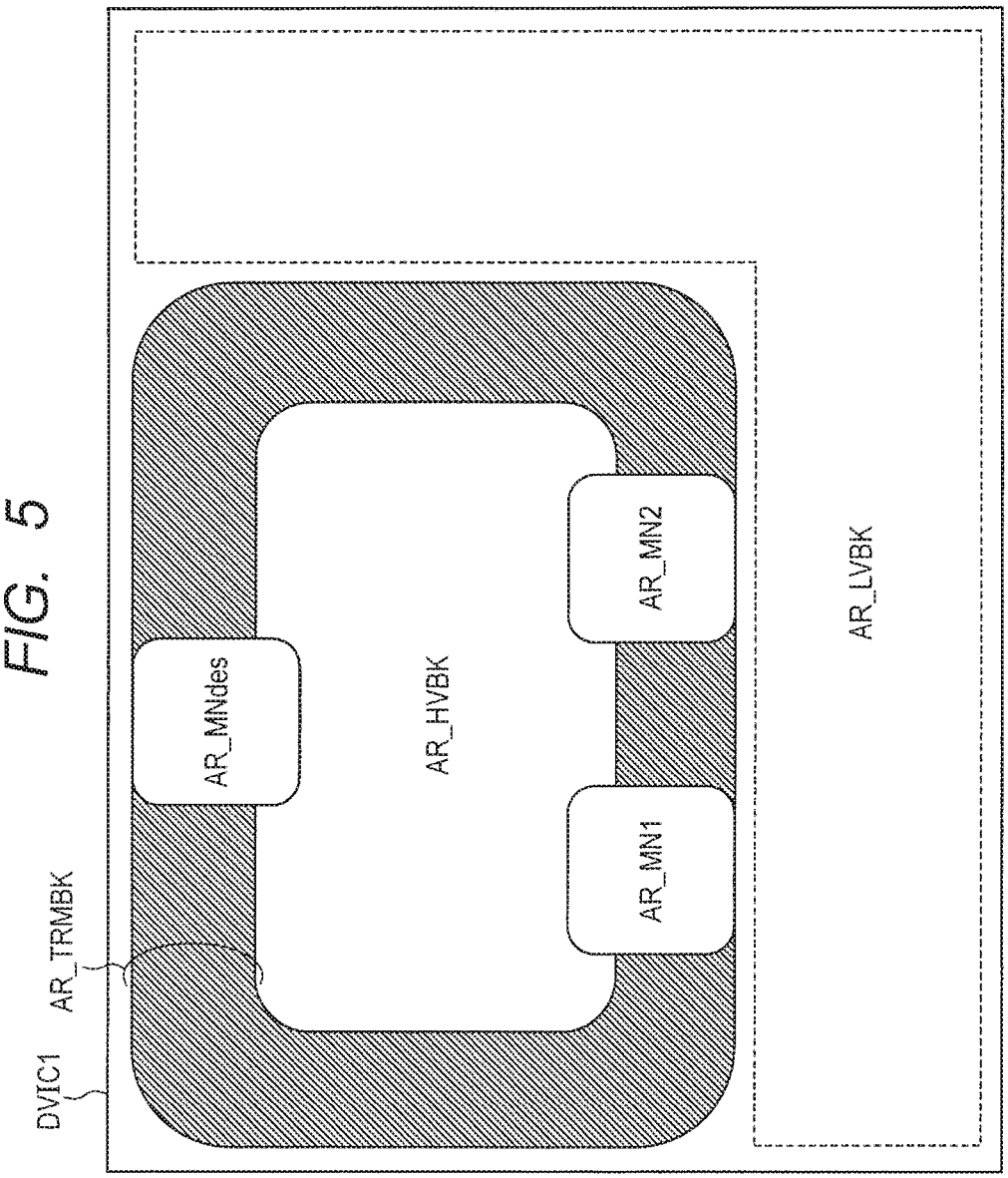
FIG. 5 is a plan view illustrating one rough configurational example of a layout of areas in the semiconductor device in FIG. 1.

FIG. 5 is a plan view illustrating one rough configurational example of a layout of areas in the semiconductor device in. FIG. 1. The semiconductor device (the driver IC) DVIC1 illustrated in FIG. 1 is configured by one semiconductor chip and on the semiconductor chip, a termination area AR_TRMBK, a low voltage area AR_LVBK, and a high voltage area AR_HVBK are formed. The telwination area AR_TRMBK has a ring-like shape and is an area that a circuit that operates at the power supply voltage VCC and a circuit that operates at the boot power supply voltage VB are mutually decoupled and coupled.

In the termination area AR_TRMBK, the respective circuits illustrated in a termination unit TRMBK in FIG. 1 are formed. Specifically, in the termination area AR_TRMBK, an area AR_MN1 for the level shift MOS (MN1), an area AR_MN2 for the level shift MOS (MN2) and an area AR_MNdes for the sense MOS (MNdes) are provided. That is, in the termination area AR_TRMBK, a transistor that has the voltage resistance of at least about 150 V, desirably, the voltage resistance of at least about 300 V (for example, about 600 V) between a source and a drain thereof is formed.

The low voltage area ZAR_LVBK is arranged outside the termination area ZAR_TRMBK and circuits that operate at the power supply voltage VCC on the basis of the reference voltage COM are formed in the low voltage area AR_LVBK. Specifically, in the low voltage area AR_LVBK, the input signal processing unit LGC, the low side drive unit LSU, the fault detection circuit FDET in the fault detection unit FDETU and some circuits (details will be described later) in the boot strap circuit BSC illustrated in FIG. 1 are formed.

The high voltage area AR_HVBK is arranged inside the termination area AR_TRMBK and circuits that operate at the boot power supply voltage VB on the basis of the floating voltage VS are formed in the high voltage area ZAR_HVBK. Specifically, in the high voltage area AR_HVBK, the high side drive unit HSU and the resistors R1 and R2 in the level shift circuit LSC are formed as illustrated in the high voltage circuit unit HVBK in FIG. 1.

Figure 6:
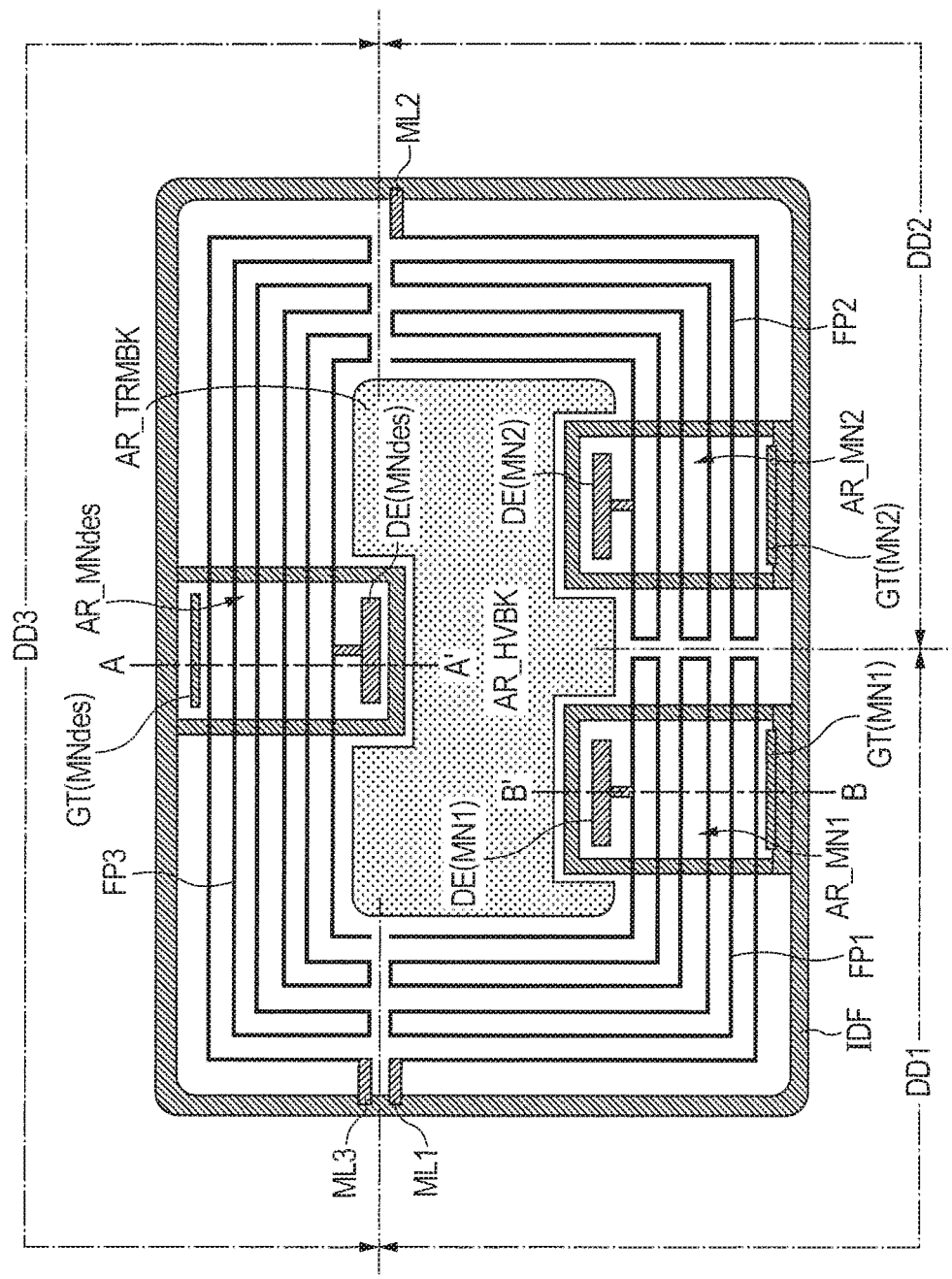
FIG. 6 is a plan view illustrating one detailed configurational example of a layout of a termination area in FIG. 1.

FIG. 6 is a plan view illustrating one detailed configurational example of a layout of the termination area in FIG. 5. The termination area AR_TRMBK has a ring-like shape and an isolation layer IDF, that is, for example, a p-type semiconductor area is arranged on an outer periphery of the ring. The isolation layer IDF is further arranged so as to surround each of the area AR_MN1 of the level shift MOS (MN1), the area AR_MN2 of the level shift MOS (M2) and the area AR_MNdes of the sense MOS (MNdes).

Three field plates FP1 to FP3, gate layers GT (MN1) and GT (MN2) of the level shift MOSs (MN1 and MN2) and a gate layer GT (MNdes) of the sense MOS (MNdes) are formed in an inner area that is located between the outer periphery and an inner periphery of the ring. The field plates FP1 to FP3 and the respective gate layers GT (MN1), GT (MN2), and GT (MNdes) each is made of, for example, polysilicon and so forth.

Here, the termination area AR_TRMBK has three sections DD1 to DD3 obtained by almost equally dividing the ring into three parts in an orbiting direction of the ring. The sense MOS (MNdes) and the two level shift MOSs (MN1 and MN2) are respectively formed in partial sections in mutually different sections in the three sections DD1 to DD3. In the example in FIG. 13, the sense MOS (MNdes) is formed in the partial section surrounded by the isolation layer IDF in the section DD3. Likewise, the level shift MOS (MN1) is formed in the partial section surrounded by the isolation layer IDF in the section DD1 and the level shift MOS (MN2) is formed in the partial section surrounded by the isolation layer IDF in the section DD2.

The field plates FP1, FP2 and FP3 are respectively formed in the sections DD1, DD2 and DD3. The field plate FP1 extends along the orbiting direction of the ring and extends from the inner peripheral side toward the outer peripheral side (or from the outer peripheral side toward the inner peripheral side) of the ring while turning at each of boundaries between the sections DD1 and DD2 and the sections DD1 and DD3. Then, the field plate FP1 is coupled to a drain electrode DE (MNI) of the level shift MOS (MN1) on the innermost periphery of the ring and is coupled to the isolation layer IDE via a metal wiring ML1 on the outermost periphery of the ring.

Likewise, the field plate FP2 extends in the ring while turning at each of the boundaries between the sections DD2 and DD1 and the sections DD2 and DD3. The field plate FP2 is coupled to a drain electrode DE (MN2) of the level shift MOS (MN2) on the innermost periphery of the ring and is coupled to the isolation layer IDF via a metal wiring ML2 on the outermost periphery of the ring. The field plate FP3 extends in the ring while turning at each of the boundaries between the sections DD3 and DD1 and sections DD3 and DD2. The field plate FP3 is coupled to a drain electrode DE (MNdes) of the sense MOS (MNdes) on the innermost periphery of the ring and is coupled to the isolation layer IDF via a metal wiring ML3 on the oute Atiost periphery of the ring.

The gate layers GT (MN1), GT (MN2), and GT (MNdes) each is arranged so as to extend in the orbiting direction of the ring between each of the field plates FP1, FP2 and FP3 on the outermost periphery and the isolation layer IDF on the outermost periphery. The level shift MOSs (MN1 and MN2) and the sense MOS (MNdes) each is formed so as to set a gate width in the orbiting direction of the ring in the termination area AR_TRNBK as is apparent from the arrangement of the gate layers GT (MN1), GT (MN2) and gate layer GT (MNdes).

It becomes possible to configure the driver IC (DVIC1) in FIG. 1 without increasing the area of the semiconductor chip by forming not only the level shift MOSs (MN1, MN2) but also the sense MOS (MNdes) in the termination area AR_TRMRK in this way. That is, it is possible to suppress an increase in area of the semiconductor chip by building the sense MOS (MNdes) that is designed for the high voltage resistance into the semiconductor chip, in place of the externally attached diode Ddes that is designed for the high voltage resistance in FIG. 18B.

(Device Structure of the Sense MOS)

Figure 7:
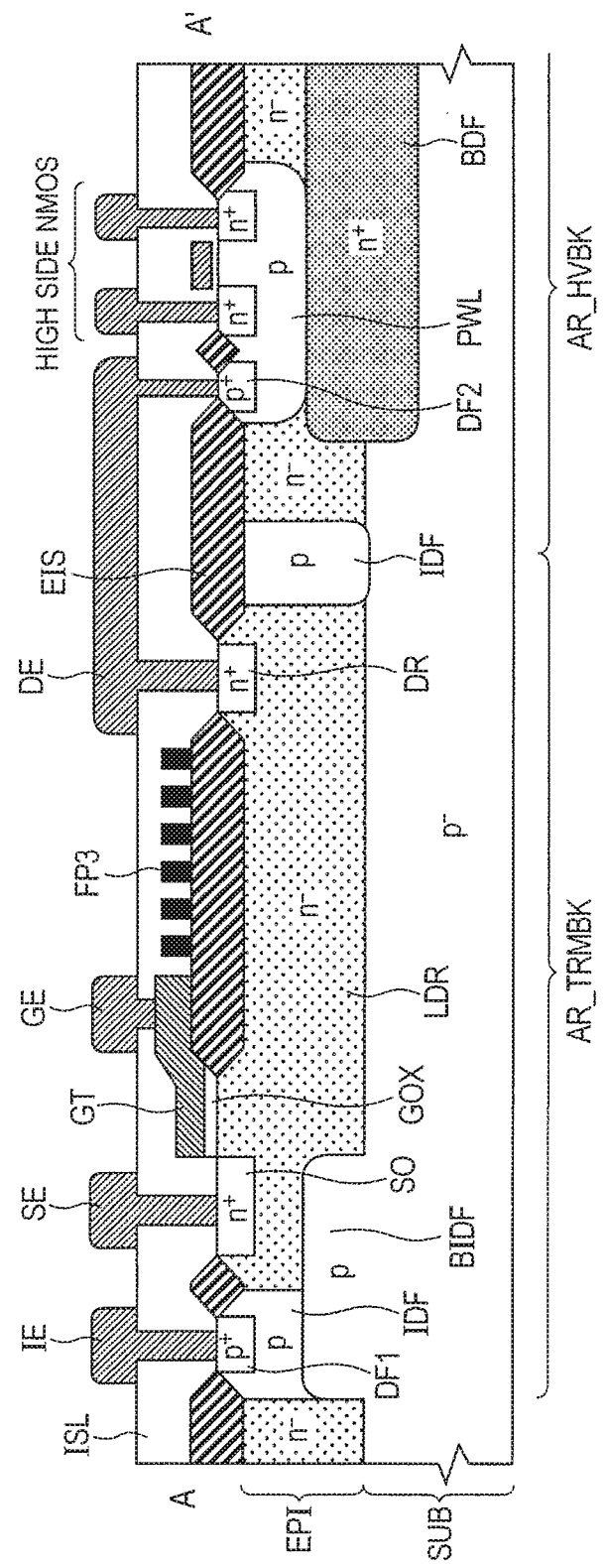
FIG. 7 is a sectional diagram illustrating one structural example of a sense MOS (along the line A-A') in FIG. 6.

FIG. 7 is a sectional diagram illustrating one structural example of the sense MOS (along the A-A' line) in FIG. 6. In FIG. 7, an n-minus type epitaxial layer EP1 is arranged on a p-minus type semiconductor substrate SUB. The epitaxial layer EP1 is isolated by the p type isolation layer IDF that extends from the principal plane (in other words, an element faulting surface) side so as to he oupled to the semiconductor substrate SUB. One of isolated parts of the epitaxial layer EP1 serves as a drift layer LDR that corresponds to the ring inner area that configures the termination area AR_TRMBK that has been described with reference to FIG. 6.

A p-plus type diffusion layer DF1 that is higher in impurity concentration than a p-type layer is arranged on the principle plane side of the isolation layer IDF. The diffusion layer DF1 is coupled to an isolation electrode IE that includes a contact layer, a metal layer and so forth. The isolation electrode IE is coupled to the reference voltage COM source. An n-plus type source diffusion layer SO that is higher in impurity concentration than an n-minus type layer is arranged on the principle plane side of the drift layer LDR and on the side close to the isolation layer IDF. The source diffusion layer SO is coupled to a source electrode SE that includes a contact layer, a metal layer and so forth. The source electrode SE is coupled to the comparator circuit CMP1 via the filter circuit LPF as illustrated in FIG. 3A. The filter circuit LPF and the comparator circuit CMP1 are formed in the low voltage area AR_LVBK in FIG. 5.

A gate layer GT that is made of polysilicon and so forth is arranged over the drift layer LDR adjacently to the source diffusion layer SO via a gate insulation film GOX. An area that is located directly under the gate insulation film GOX in the drift layer LDR serves as a channel area. The gate layer GT is coupled to a gate electrode GE that includes a contact layer, a metal layer and so forth. The gate electrode GE is coupled to the power supply voltage VCC source. An n-positive type drain diffusion layer DR is arranged on the principle plane side of the drift layer LDK and on the side apart from the isolation layer IDF. The drain diffusion layer DR is coupled to a drain electrode DE that includes a contact layer, a metal layer and so forth. The drain electrode DE, the gate electrode GE, the source electrode SE and the isolation electrode IE are mutually isolated appropriately by an interlayer insulation film ISL.

An element isolation insulation film EIS is arranged on the principle plane side of the drift layer LDR and between the drain diffusion layer DR and the channel area. The field plate FP3 that is made of polysilicon and so forth as described with reference to FIG. 6 is arranged over the element isolation insulation film EIS. A p-typeburied isolation layer BIDF is arranged in a part located under the source diffusion layer SO on the semiconductor substrate SUB. The buried isolation layer BIDF is arranged in a state of being coupled to the semiconductor substrate SUB and the isolation layer IDF.

On the other hand, respective circuits to be arranged in the high voltage area AR_HVBK that has been described with reference to FIG. 6 are formed in the epitaxial layer EP1 that is located so as to face the drift layer LDR with the isolation layer IDF on the drain electrode DE side being interposed. A buried diffusion layer BDF that extends across almost the entire surface of the high voltage area AR_HVBK is provided on a boundary part between the epitaxial layer EP1 and the semiconductor substrate SUB. The buried diffusion layer BDF is coupled to the boot power supply voltage VB source and serves to electrically isolate the semiconductor substrate SUB from the high voltage area AR_HVBK.

In the high voltage are AR_HVBK, a p-type p well PWL is appropriately formed on the principle plane side of the epitaxial layer EP1 and an NMOS transistor is formed by using the p well PWL. The NMOS transistor corresponds to, for example, the NMOS transistor and so forth of the high side driver DVh in FIG. 1. In the p well PWL, an n-plus type diffusion layer that serves as a source and a drain is formed similarly to a general structure and a p-plus type diffusion layer DF2 is formed in addition to this n-plus type diffusion layer.

Here, as is apparent from the high side driver DVh and so forth in FIG. 1, the p well PWL (that is, a substrate node of the NMOS transistor) is coupled to the floating voltage VS source on a place that is omitted in FIG. 7. The drain electrode DE illustrated in FIG. 7 is coupled to the p-plus type diffusion layer DF2 in the p well PWL and is thereby coupled to the floating voltage VS source. Incidentally, a certain potential difference occurs between the drain voltage (that is, the floating voltage VS) of the sense MOS (MNdes) and the voltage (that is, the boot power supply voltage VB) of the buried diffusion layer BDF. Therefore, as illustrated in FIG. 6 and FIG. 7, the termination area AR_TRMBK of the sense MOS (MNdes) is isolated from the high voltage area AR_HVBK by the isolation layer IDF.

It is possible to implement the depression type high voltage resistance NMOS transistor by using such a structure as mentioned above. Here, when the NMOS transistor is controlled to the OFF state, a depletion layer that is formed between the buried isolation layer BIDF and the drift layer LDR and a depletion layer that is formed in the channel area are mutually linked and thereby the current path is cut off. On this occasion, it is beneficial to provide the buried isolation layer BIDF in order to facilitate cutting-off of the current path under the source diffusion layer SO. It is possible to adjust the step-up voltage Vsup as described with reference to FIG. 4 by using, for example, the impurity concentration in the channel area, the size of the buried isolation layer BIDF and so forth as parameters.

In addition, although not illustrated in FIG. 7, the field plate FP3 illustrated in FIG. 7 is coupled to the drain electrode DE at one end that is closer to the drain electrode DE and is coupled to the isolation layer IDF (that is, the reference voltage COM source) at one end that is closer to the source electrode SE as described with reference to FIG. 6. Consequently, the voltage of the field plate FP3 is stepwise lowered from the side closer to the drain electrode DE toward the side closer to the source electrode SE. It becomes possible to unify an expanse of the depletion layer formed in the drift layer LDR by letting the voltage have such a voltage gradient as mentioned above.

Here, it is also conceivable to use, for example, such a configuration that one field plate is provided, instead of the plurality of field plates as illustrated in FIG. 6 and one end of the field plate is coupled to the boot power supply voltage VB source. However, for example, the drain electrode DE of the sense MDS (NNdes) is not coupled to the boot power supply voltage BV source but to the floating voltage source VS source. In this case, it is feared that, for example, in the isolation layer IDF that surrounds the sense MOS (MNdes), a parasitic MOS configured such that one field plate is used as a gate and the drift LDR is used as a source and a drain may be turned on and thereby leakage current may be generated via the isolation layer IDF. On the other hand, as illustrated in FIG. 6, it is possible to prevent generation of such a parasitic MOS as mentioned above by using a configuration that a special field plate is prepared for the transistor that the drain is not coupled to the boot power supply voltage VB source and one end of the special field plate is coupled to the drain of the corresponding transistor as illustrated in FIG. 6.

(Device Structure of the Sense MOS (Altered Example))

Figure 8:
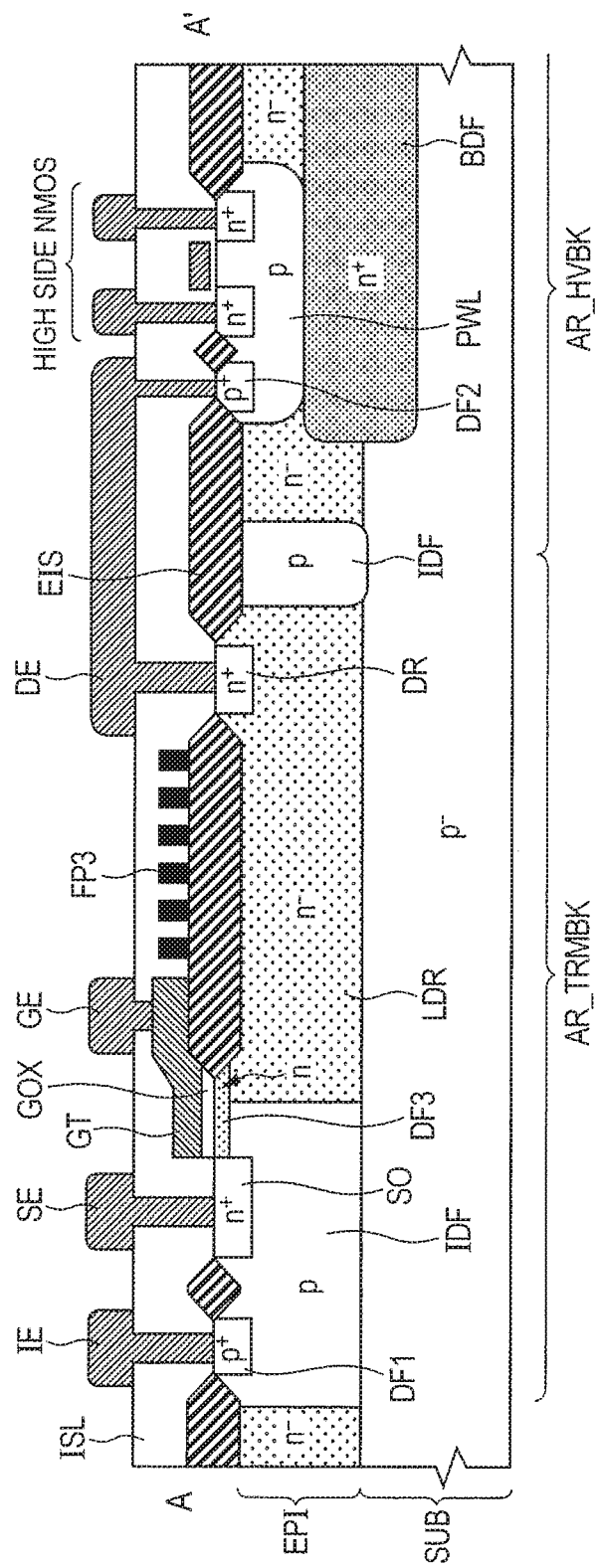
FIG. 8 is a sectional diagram, illustrating one structural example that is different from that in FIG. 7 of the sense MOS (along the line A-A') in FIG. 6.

FIG. 8 is a sectional diagram illustrating a structural example of the sense MOS (along the A-A' line) in FIG. 6 that is different from that in FIG. 7. The structural example illustrated in FIG. 8 is different from that in FIG. 7 in the points that the buried isolation layer BIDF is not arranged, the p-type isolation layer IDF extends up to a part under the gate insulation film COX beyond the source diffusion layer SO and an n-type diffusion layer DF3 is arranged directly under the gate insulation film GOX. In association with the above-mentioned arrangement, the source diffusion layer SO is arranged in the isolation layer IDF. Other structures are the same as those in FIG. 7 and therefore detailed description thereon is omitted.

The n-type element is higher than the n-minus type element and is lower than the n-plus type element in impurity concentration. The diffusion layer DF3 is arranged so as to couple together the source diffusion layer SO and the drift layer LDR between the p-type isolation layer IDF and the gate insulation film GOX. It is also possible to implement the depression type high voltage resistance NMOS transistor by using such a structure as mentioned above. Adjustment of the step-up voltage Vsup is performed by using, for example, the impurity concentration of the diffusion layer DF3 as the parameter.

(Device Structure of the Level Shift MOS)

Figure 9:
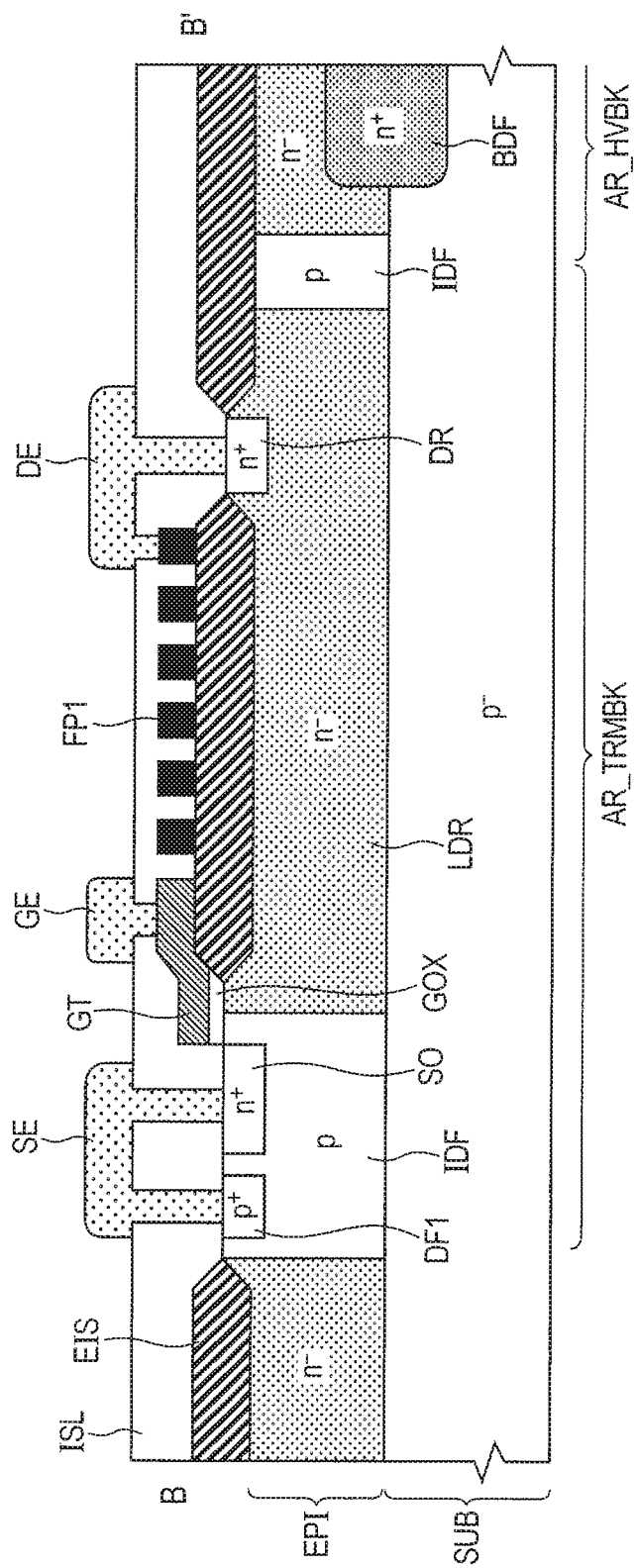
FIG. 9 is a sectional diagram illustrating one structural example of a level shift MOS (along the line B-B') in FIG. 6.

FIG. 9 is a sectional diagram illustrating one structural example of the level shift MOS (along the B-B' line) in FIG. 6. The structural example of each level shift MOS (MN1, MN2) illustrated in FIG. 9 is different from the structural example in FIG. 8 mainly in the points that the diffusion layer DF3 is not arranged and the source electrode SE commonly serves as the isolation electrode IE and the source electrode SE. In addition, in the example in FIG. 9, the NMOS transistor in the high voltage area AR_HVBK illustrated in FIG. 7 and so forth is omitted. Other structures are the same as those in FIG. 8 and therefore detailed description thereon is omitted.

The source electrode SE is coupled to the reference voltage COM source, the gate electrode GE is coupled to the pulse generation circuit PGEN that is formed in the low voltage area AR_LVBK in FIG. 5, and the drain electrode DE is coupled to the resistors R1 and R2 and the high side drive unit HSU formed in the high voltage area AR_HVBK in FIG. 5. The drain voltage of each of the level shift MOSs (MN1 and MN2) shifts independently of the voltage (that is, the boot power supply voltage VB) of the buried diffusion layer BDF. Therefore, as illustrated in FIG. 6 and FIG. 9, the termination area AR_TRBK in each of the level shift M (MN1 and MN2) is isolated from the high voltage area AR_HVBK by the isolation layer IDF.

The level shift MOSs (MN1 and MN2) in FIG. 9 each is configured by the enhancement type NMOS transistor differently from the aforementioned sense MOS (MNdes). That is, the level shift MOSs (MN1 and MN2) each operates by using the p-type isolation layer IDF that is arranged directly under the gate insulation film GOX in FIG. 9 as a channel area. For example, when in the level shift MOS (MN1) and the sense MOS (MNdes), the gate-to-source voltage of each MOS is set to about 0 V and the source-to-drain voltages are made the same as each other, a source-to-drain current of the sense MOS (MNdes) becomes larger than a source-to-drain currentof the level shift MOS (MN1).

In addition, as described with reference to FIG. 7, in the example in FIG. 9, one end of the field plate FP1 on the drain electrode DE side is coupled to the drain electrode DE, one end of the field plate FP1 on the source electrode SE side is coupled to the isolation layer IDF (that is, the reference voltage source COM source) although not illustrated in FIG. 9. Consequently, similarly to the case in FIG. 7, it becomes possible to unify the expanse of the depletion layer to be formed in the drift layer LDR and further it is also possible to avoid a situation that the parasitic MOS is turned on.

Incidentally, it may be necessary for the field plates FP1, FP2 and FPO3 that are provided respectively corresponding to the two level shift MOSs (MN11 and MN2) and the sense MOS (MNdes) to have high resistance values (that is, to have sufficient wiring lengths) in order to control the currents that flow through the field plates and it is desirable for the field plates to have equal lengths. Therefore, it becomesbeneficial to use such a layout that the three sections DD1 to DD3 are prepared in the termination area AR_TRMBK and the transistor is arranged in each of the sections as described with reference to FIG. 6.

(Representative Advantageous Effects of the First Embodiment)

As described above, representatively, it becomes possible to implement miniaturization, cost reduction and so forth of the electric power control apparatus that includes the semiconductor device by using the semiconductor device (the driver IC (DVIC1) according to the first embodiment. Such advantageous effects are obtained, in particular, by forming the sense MOS (MNdes) in the termination are AR_TRMBK. That is, thereby, it is possible to build the function corresponding to the diode Ddes illustrated in FIG. 18B into the semiconductor device and further it is also possible to suppress an increase in circuit area of the semiconductor device which would occur in association with building-in of the function of the diode Ddes.

Second Embodiment (Details of the Fault Detection Unit (Application Example)

Figure 10:
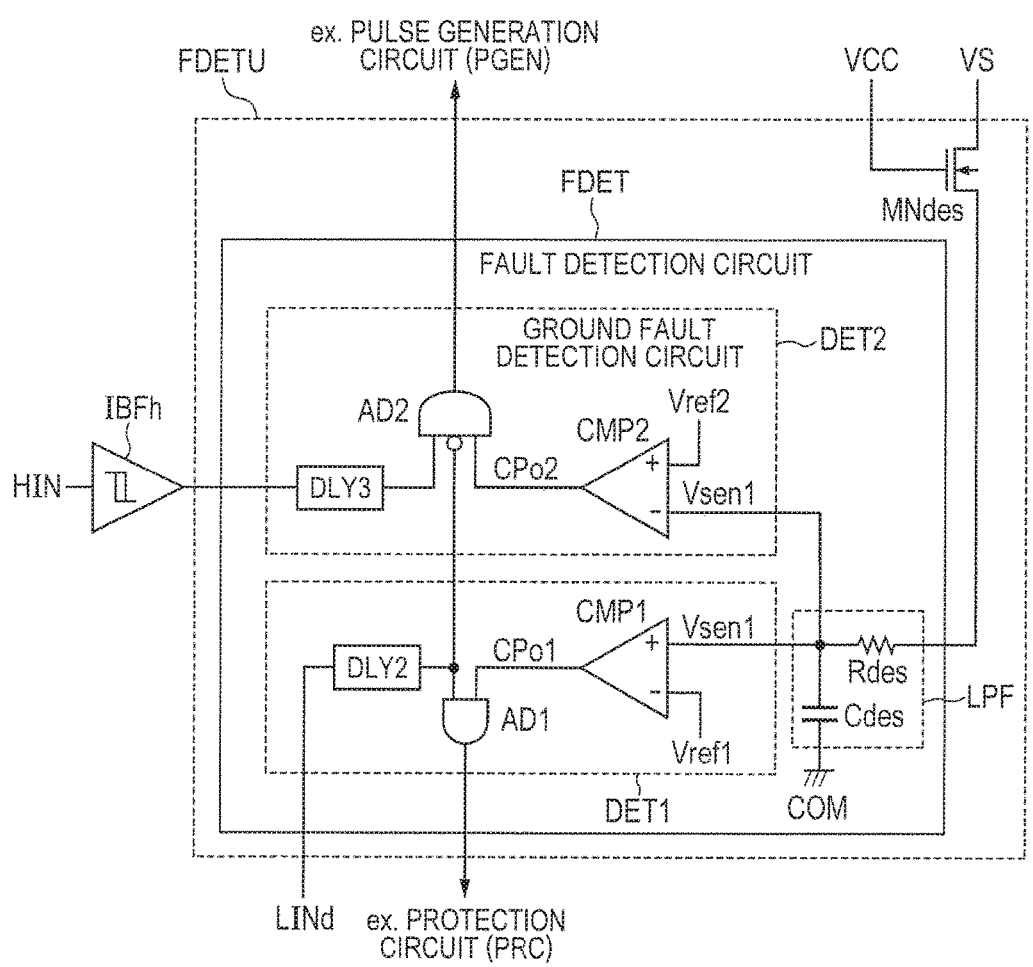
FIG. 10 is a circuit diagram illustrating one configurational example of a fault detection unit in FIG. 1 in a semiconductor device according to a second embodiment of the present invention.

FIG. 10 is a circuit diagram illustrating one configurational example of the fault detection unit in FIG. 1, in a semiconductor device according to the second embodiment. The configurational example of the fault detection unit DDETU illustrated in FIG. 10 is different from the configurational example of the fault detection unit illustrated in FIG. 3A in the point that a ground fault detection circuit DET2 is additionally provided in the fault detection circuit FDET.

The ground fault detection circuit DET2 includes a comparator circuit CMP2 and also includes, for example, a delay circuit DLY3, an AND operation circuit AD2 and so forth in addition to the comparator circuit CMP2. The comparator circuit CMP2 compares the sense voltage Vsen1 that serves as an output voltage of the filter circuit LPF with a predetermined decision voltage Vref2 that has been determined in advance and outputs an output signal CPO2 according to a result of comparison. Here, when Vsen1<Vref2, the output signal CPo2 shifts to the 'H' level and when Vsen1<Vref2, the output signal CPo2 shifts to the 'L' level.

The delay circuit DLY 3 delays, for example, the output signal of the high side input buffer IBFh illustrated in FIG. 1. The delay circuit DLY 3 ensures a time period taken until the high side transistor TH is actually turned on after the output signal of the high side input buffer IBFh has shifted to the 'H' level. When both of the output signal of the delay circuit DLY3 and the output signal CPo2 of the comparator circuit CMP2 are at the 'H' levels and the output signal of the delay circuit DLY2 is at the 'L' level, the AND operation circuit AD2 outputs a 'H' level signal indicative of presence of the fault to, for example, the pulse generation circuit PGEN in FIG. 1.

The fault concerned corresponds to the ground fault illustrated in FIG. 18A. In case of the ground fault, for example, the floating voltage VS (the voltage of the load drive terminal OUT2) becomes lower than the predetermined voltage irrespective of a situation that the low side transistor TL (the low side arm LA2 in FIG. 18A) is in the OFF state and the high side transistor TH (the high side arm HA2 in FIG. 18A) is in the ON state. When the ground fault does not occur, the floating voltage VS generally shifts to a level close to the input power supply voltage VIN and therefore the decision voltage Vref2 may be appropriately determined within a range that is lower than "VCC (the power supply voltage)+Vsup (the step-up voltage)".

The ground fault detection circuit DET2 detects presence of the fault when the sense voltage Vsen1 is lower than the decision voltage Vref2 in the time period that the low side driver DVI is driving the low side transistor TL to the OFF state and the high side driver DVh is driving the high side transistor TH to the ON state respectively in this way. The pulse generation circuit PGEN turns the high side transistor TH off when presence of the fault has been detected.

As described above, it is possible to implement detection of the ground fault and protection against the ground fault without causing increasing in size and cost of the electric power control apparatus that includes the semiconductor device according to the second embodiment, in addition to the various advantageous effects described in the first embodiment, by using the semiconductor device according to the second embodiment.

Third Embodiment (Configuration of the Bootstrap Circuit)

Figure 11:
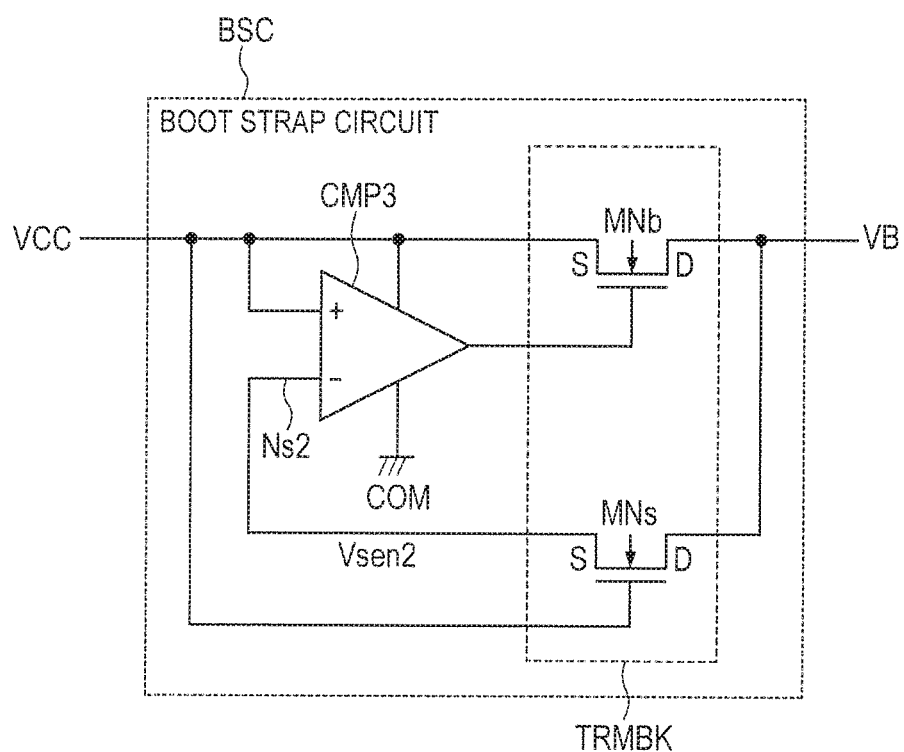
FIG. 11 is a circuit diagram illustrating one configurational example of a bootstrap circuit in FIG. 1 in a semiconductor device according to a third embodiment of the present invention.

FIG. 11 is a circuit diagram illustrating one configurational example of the bootstrap circuit in FIG. 1, in a semiconductor device according to the third embodiment of the present invention. The boot strap circuit BSC illustrated in FIG. 11 includes two NMOS transistors MNb and MNs, a comparator circuit CMP3 and so forth. The NMOS transistor MNb is arranged between the pad (the power supply terminal) P1 to be coupled to the power supply voltage VCC source and the pad (the power supply terminal) P4 to be coupled to the boot power supply voltage VB source. The NMOS transistor MNs is arranged between the pad P4 (the boot power supply voltage VB source) and a sense node Ns2 and is driven at the power supply voltage VCC. In the following, in the present embodiment, the NMOS transistor MNb will be referred to as a boot MOS and the NMOS transistor MNs will be referred to as a boot-use sense MOS.

In the boot MOS (MNb), a source (S) is coupled to the power supply voltage VCC source and a drain (D) is coupled to the boot power supply voltage VB source. In the boot-use sense MOS (MNs), a source (S) is coupled to the sense node Ns2 and a drain (D) is coupled to the boot power supply voltage VB source. The boot MOS (MNb) assumes a function that is equivalent to that of a bootstrap diode that a general bootstrap circuit includes. It is requested to configure both of the boot MOS (MNb) and the boot-use sense MOS (MNS) by the high voltage resistance elements.

The comparator circuit CMP3 operates at the power supply voltage VCC on the basis of the reference voltage COM. The comparator circuit CMP3 drives the boot MOS (MNb) to the ON state when a sense voltage Vsen2 of the sense node Ns2 is lower than the power supply voltage VCC. On the other hand, the comparator circuit CMP3 drives the boot MOS (MNb) to the OFF state when the sense voltage Vsen2 is higher than the power supply voltage VCC.

Here, the boot-use sense MOS (MNs) has the depression type configuration as in the case of the sense MOS (MNdes) described in the first embodiment. It is possible for the boot-use sense MOS (MNs) to transmit the boot power supply voltage VS to the sense node Ns2 until the boot power supply voltage VB exceeds "VCC (the power supply voltage) (for example, about 15 V)+Vsup (the step-up voltage)". On the other hand, the boot-use sense MOS (MNs) clamps the voltage (the sense voltage Vsen2) of the sense node Ns2 to "VCC (the power supply voltage)+Vsup (the step-up voltage)" when the boot power supply voltage VB exceeds "VCC (the power supply voltage)+Vsup (the step-up voltage)".

Consequently, it is possible to configure the comparator circuit CMP3 by the low voltage resistance element, and it is possible to decide whether the boot power supply voltage VB has reached the power supply voltage VCC within a range that the boot power supply voltage VB is not a high voltage in the same manner as the case in FIG. 3B. When the boot power supply voltage VS does not reach the power supply voltage VCC, the boot MOS (MNb) is driven to the ON state by the comparator circuit CMP3 and charges the bootstrap capacitor CB illustrated in FIG. 1 by application of the power supply voltage VCC. On the other hand, when the boot power supply voltage VB has exceeded the power supply voltage VCC, the boot MOS (MNb) is driven to the OFF state by the comparator circuit CMP3 and decouples the power supply voltage VCC source from the bootstrap capacitor CB.

Thereby, for example, in such an actual operation as illustrated in FIG. 2, first, in the time period t3 that the low side transistor TL is turned on, the floating voltage VS almost reaches the level of the reference voltage COM and in general since the boot power supply voltage VB is smaller than the power supply voltage VCC, the boot MOS (MNb) is driven to the ON state. Consequently, the bootstrap capacitor CB is charged up to the level of the power supply voltage VCC. On the other hand, when the low side transistor TL is turned off (the time period t4), the floating voltage VS rises and also the boot power supply voltage VB rises accordingly and exceeds the power supply voltage VCC, and therefore the boot MOS (MD) is driven to the OFF state.

Then, in the time period t1 that the high side transistor TH is turned on, the boot MOS (MNb) maintains the OFF state. In the time period ti, the high side driver DVh drives the high side transistor TH to the ON state by using the power supply voltage VCC that has been charged in advance to the bootstrap capacitor CB on the basis of the floating voltage VS. Then, the charged voltage of the bootstrap capacitor CB is lowered and becomes lower than the power supply voltage VCC. Then, when the high side transistor TH is turned off (the time period t2), the floating voltage VS is lowered and also the boot power supply voltage VB is lowered by that amount. Then, at a time point that the boot power supply voltage VB has become lower than the power supply voltage VCC, the boot MOS (MNb) is again driven to the ON state and starts charging for compensating for the lowered amount of the charged voltage of the bootstrap capacitor CB. Subsequently, the same operations are repeated by returning to the time period t3.

(Rough Layout Configuration of the Driver IC (Application Example))

Figure 12:
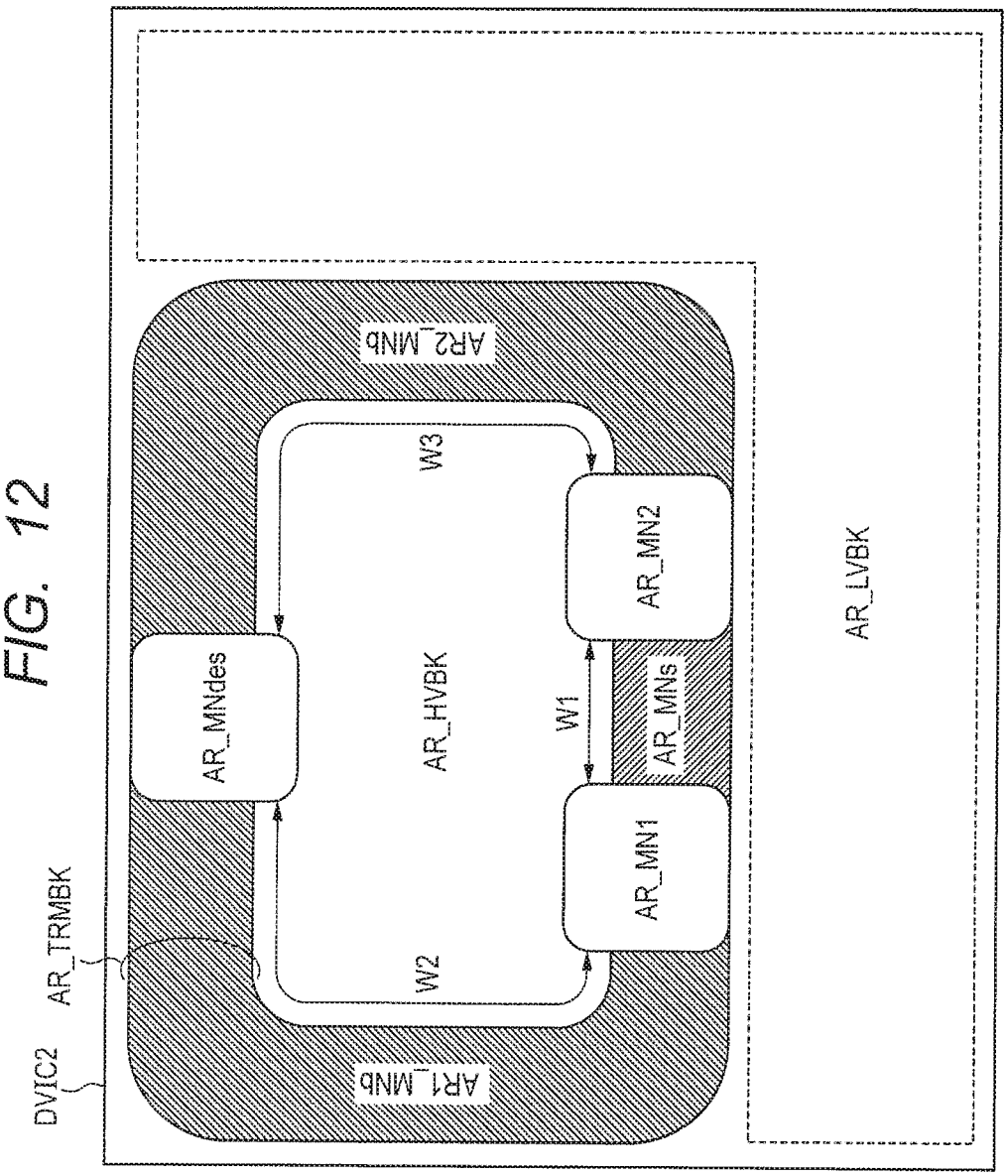
FIG. 12 is a plan view illustrating one rough configurational example of a layout of areas in the semiconductor device according to the third embodiment of the present invention.

FIG. 12 is a plan view illustrating one rough configurational example of a layout of areas of a semiconductor device according to the third embodiment of the present invention. The configurational example of a semiconductor device (a driver IC) DVIC2 illustrated in FIG. 12 is different from the configurational example illustrated in FIG. 5 in the point that areas AR1_MNb and AR2_MNb of the boot MOS (MNb) and an area AR_MNs of the boot-use sense MOS (MNs) are additionally provided in the termination area AR_TRMBK.

In the example in FIG. 12, the level shift MOS (M1) and the level shift MOS (MN2) are arranged at an interval W1 in the orbiting direction of the ring of the tertaination area AR_TRMBK. The sense MOS (MNdes) and the level shift MOS (M1) are arranged at an interval W2 that is larger than the interval W1 in the orbiting direction of the ring. The sense MOS (MNdes) and the level shift MOS (MN2) are arranged at an interval W3 that is equivalent to the interval W2 in the orbiting direction of the ring. Then, the boot MOS (MNb) is arranged in each of an area corresponding to the interval W2 and an area corresponding to the interval W1 arid the boot-use sense MOS (MNs) is arranged in an area corresponding to the interval W1.

Figure 13:
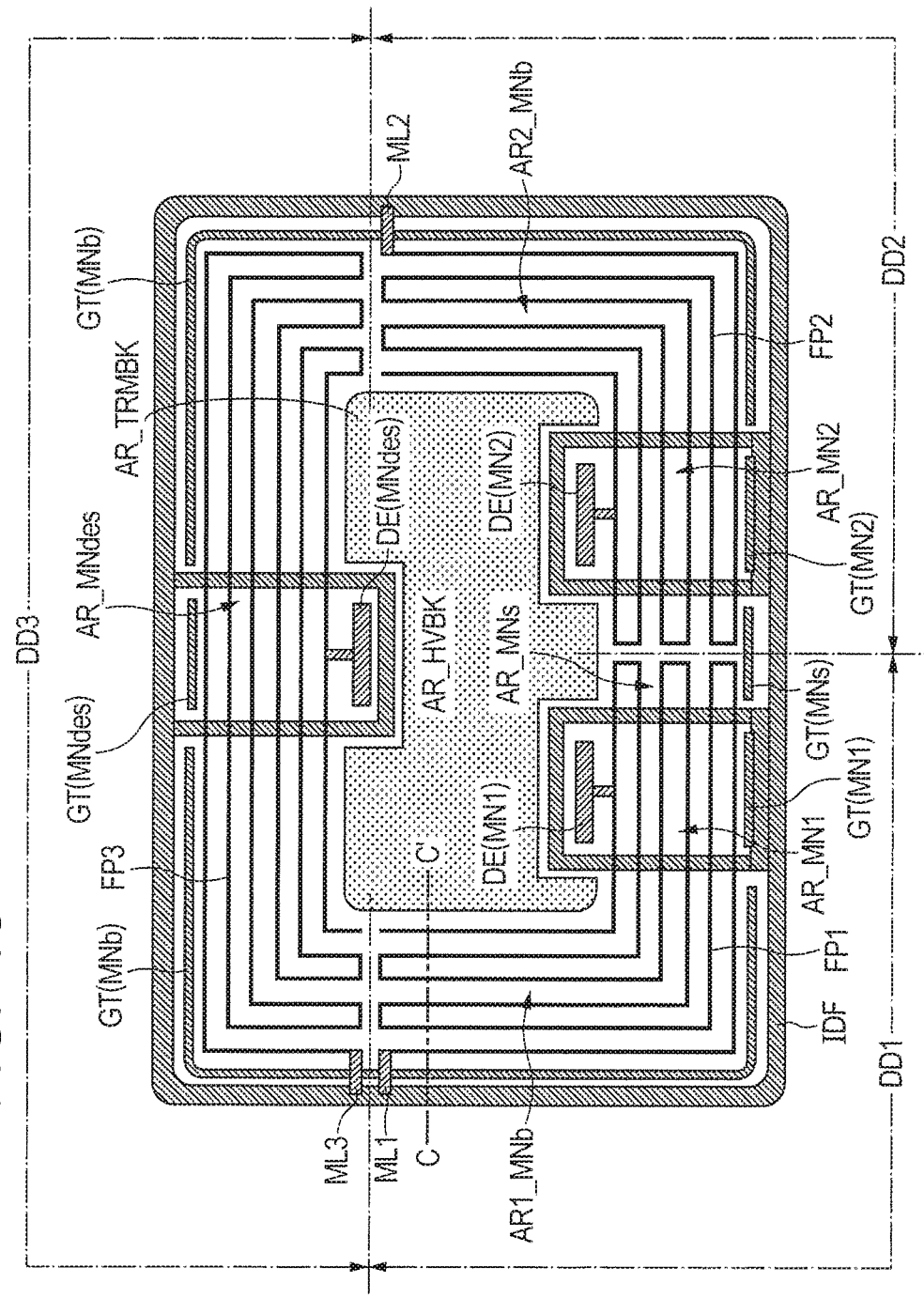
FIG. 13 is a plan view illustrating one detailed configurational example of a layout of a termination area in FIG. 12.

FIG. 13 is a plan view illustrating one detailed configurational example of a layout of the termination area in FIG. 12. The configurational example of the termination area AR_TRMBK illustrated in FIG. 13 is different from the configurational example illustrated in FIG. 6 in the points that a gate layer GT (MNb) of the boot MOS (MNb) is formed in each of the areas AR1_MNb and AR2_MNb and a gate layer GT (MNs) of the boot-use sense MOS (MNs) is formed in the area AR_MNs. Although in the example in FIG. 13, the gate layer GT (MNb) of the boot MOS (MNb) is formed by being divided into two areas, the two areas are commonly coupled via not illustrated an upper wiring layer and so forth in reality. Likewise, sources are commonly coupled and also drains are commonly coupled in these two areas.

As apparent from the arrangement of the gate layers GT (MNb) and GT (MNs), the boot MOS (MNb) and the hoot-use sense MOS (MNs) each is formed so as to set a gate width in the orbiting direction of the ring in the termination area AR_TRMBK. The gate width (that is, a total wiring length of the gate layer GT (MNb)) of the boot MOS (MNb) is larger than the gate width (that is, a wiring length of the gate layer GT (MNs)) of the boot-use sense MOS (MNs). As described with reference to FIG. 11, it is requested to the boot MOS (MNb) to charge the bootstrap capacitor CB, it is desirable that the boot MOS (MNb) be low in resistance. On the other hand, since almost ent flows into the boot-use sense MOS (MNs), the boot-use sense MOS (MNs) may be higher in resistance than the boot MOS (MNb). Accordingly, it is beneficial to have a difference between the gate widths of the boot MOS (MNb) and the boot-use sense MOS (MNs) in this way.

(Device Structures of the Boot MOS and the Boot-Use Sense Mos)

Figure 14:
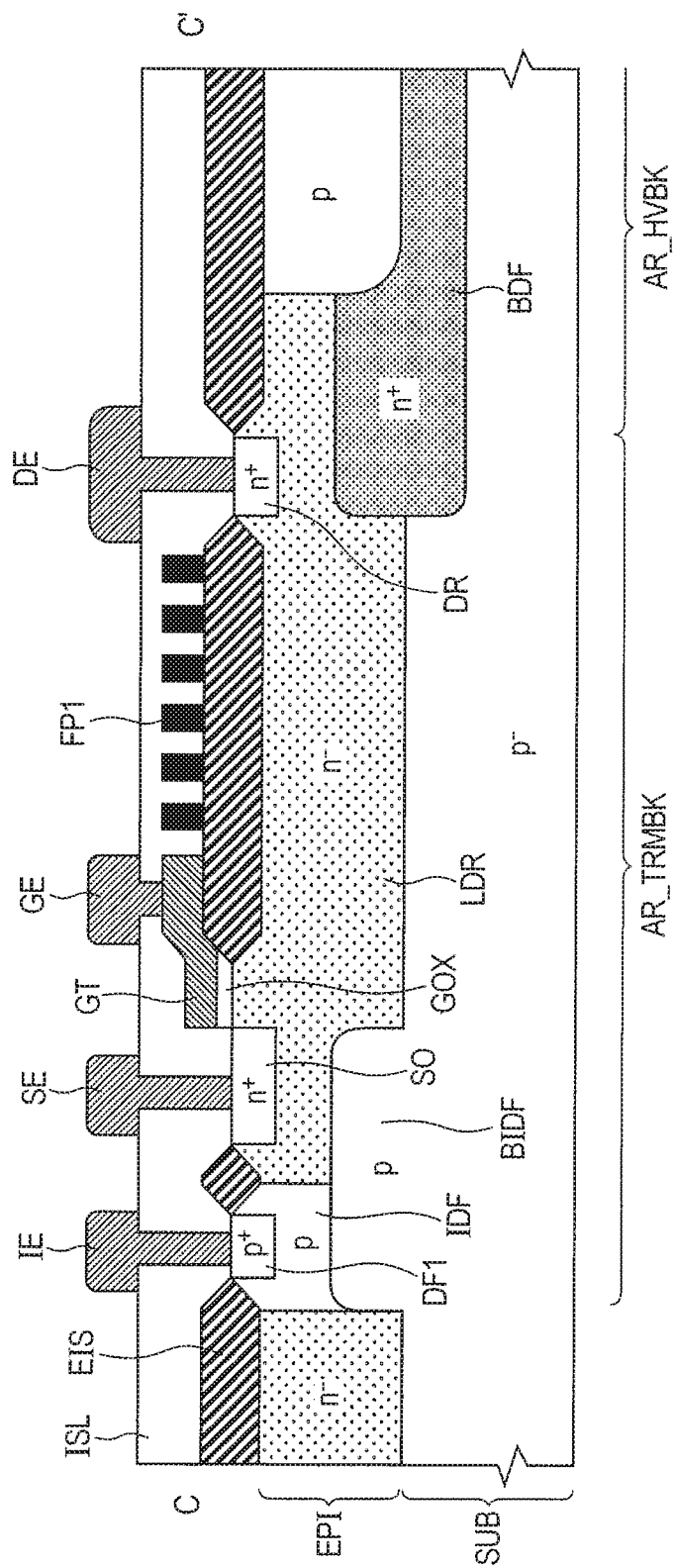
FIG. 14 is a sectional diagram illustrating one structural example of a boot MOS (along the line C-C') in FIG. 13.

FIG. 14 is a sectional diagram illustrating one structural example of the boot MOS (along the C-C' line) in FIG. 13. The structural example of the boot MOS illustrated in FIG. 14 is different from the structural example of the sense MOS (Mdes) illustrated in FIG. 7 in the point that the structure of the boundary between the termination area AR_TRMBK and the high voltage area RA_HVBK is different from the structure of the boundary in FIG. 7. That is, while in FIG. 7, the isolation layer IDF is provided on the boundary, in FIG. 14, the isolation layer IDF is not provided and the buried diffusion layer BDF extends up to the vicinity of a part under the drain diffusion layer DR.

Since the drain electrode DE of the boot MOS (MNb) is coupled to the boot power supply voltage VB source as illustrated in FIG. 11, it is not particularly requested to provide the isolation layer between the drain electrode DE and the buried diffusion layer EDF to be coupled to the boot power supply voltage VB source similarly. In the boot MOS (MNb) in FIG. 14, the source electrode SE is coupled to the power supply voltage VCC source, the gate electrode GE is coupled to the comparator circuit CMP3 provided in the low voltage area AR_LVBK in FIG. 12 and the isolation electrode IE is coupled to the reference voltage COM source.

In addition, as illustrated in FIG. 14, the boot MOS (MNb) is configured by the depression type transistor. That is, as apparent from FIG. 11, since it is requested to the boot MOS (MNb) to turn on when the gate has been driven at the power supply voltage VCC, the boot MOS (MNb) is configured by the depression type transistor. Incidentally, in FIG. 14, the field plate FP1 for the level shift MOS (MN1) is arranged over the element isolation insulation film EIS. Since the drain electrode of the boot MOS (MNb) is coupled to the boot power supply voltage VB source, it is not particularly requested to provide a special field plate for the boot MOS (MNb).

On the other hand, also the boot-use sense MOS (MNs) has the same sectional structure as that in FIG. 14. In the boot-use sense MOS (MNs), the drain electrode DE is coupled to the boot power supply voltage VB source, the source electrode SE is coupled to the comparator circuit CMP3 provided in the low voltage area AR_LVBK in FIG. 12 and the gate electrode GE is coupled to the power supply voltage VCC source. Incidentally, it is not particularly requested to provide the special field plate for the boot-use sense MOS (MNs) similarly to the boot MOS (MNb).

Here, in the example in FIG. 13, the two level shift MOSs (MN1 and MN2) and the sense MOS (MNdes) each is surrounded by the isolation layer IDF. It becomes possible to efficiently isolate from one another the source diffusion layers SO, the drift layers LDR and the drain diffusion layers DR of the five transistors (MN1, MN2, MNdes, MNb and MNs) formed in the termination area AR_TRMBK by surrounding the three transistors by the isolation layer IDF.

For example, the drains of the boot MOS (MNb) and the boot-use sense MOS (MNs) are both coupled to the boot power supply voltage VS source and therefore no isolation layer IDF is provided on the high voltage area AR_HVBK side as described with reference to FIG. 14. However, the source diffusion layers SO of the boot MOS (MNb) and the boot-use sense MOS (MNs) are different from each other in coupling destination and therefore it is requested to mutually isolate the source diffusion layers SO. In the example in FIG. 13, isolation is performed by utilizing the isolation layer IDF that surrounds the two level shift MOSs (MN1 and MN2) respectively.

As has been described above, it becomes possible to implement further miniaturization, cost reduction and so forth of the electric power control apparatus that includes the semiconductor device concerned by using the semiconductor device according to the third embodiment, in addition to the various advantageous effects described in the first embodiment and so forth. That is, in general, the bootstrap circuit is configured by using the bootstrap diode that is the component to be externally attached to the semiconductor device (the driver IC). On the other hand, in the third embodiment, since the bootstrap diode is implemented by using the boot MOS (MNb), the boot-use sense MOS (MNs) and so forth that are built into the semiconductor device, provision of the externally attached bootstrap diode is eliminated.

Further, as illustrated in FIG. 12 and FIG. 13, it is possible to efficiently the boot MOS (MNb) arid the boot-use sense MOS (MNs) in the termination area AR_TRMBK including the level shift MOSs (MN1 and MN2) and the sense MOS (MNdes). Consequently, even when the boot MOS (MNb) and the boot-use sense MOS (MNs) have been built into the semiconductor device in addition to the sense MOS (MNdes), it is possible to sufficiently suppress an increase in circuit area of the semiconductor device.

Fourth Embodiment (Rough Circuit Configuration of Electric Power Control Apparatus)

Figure 15:
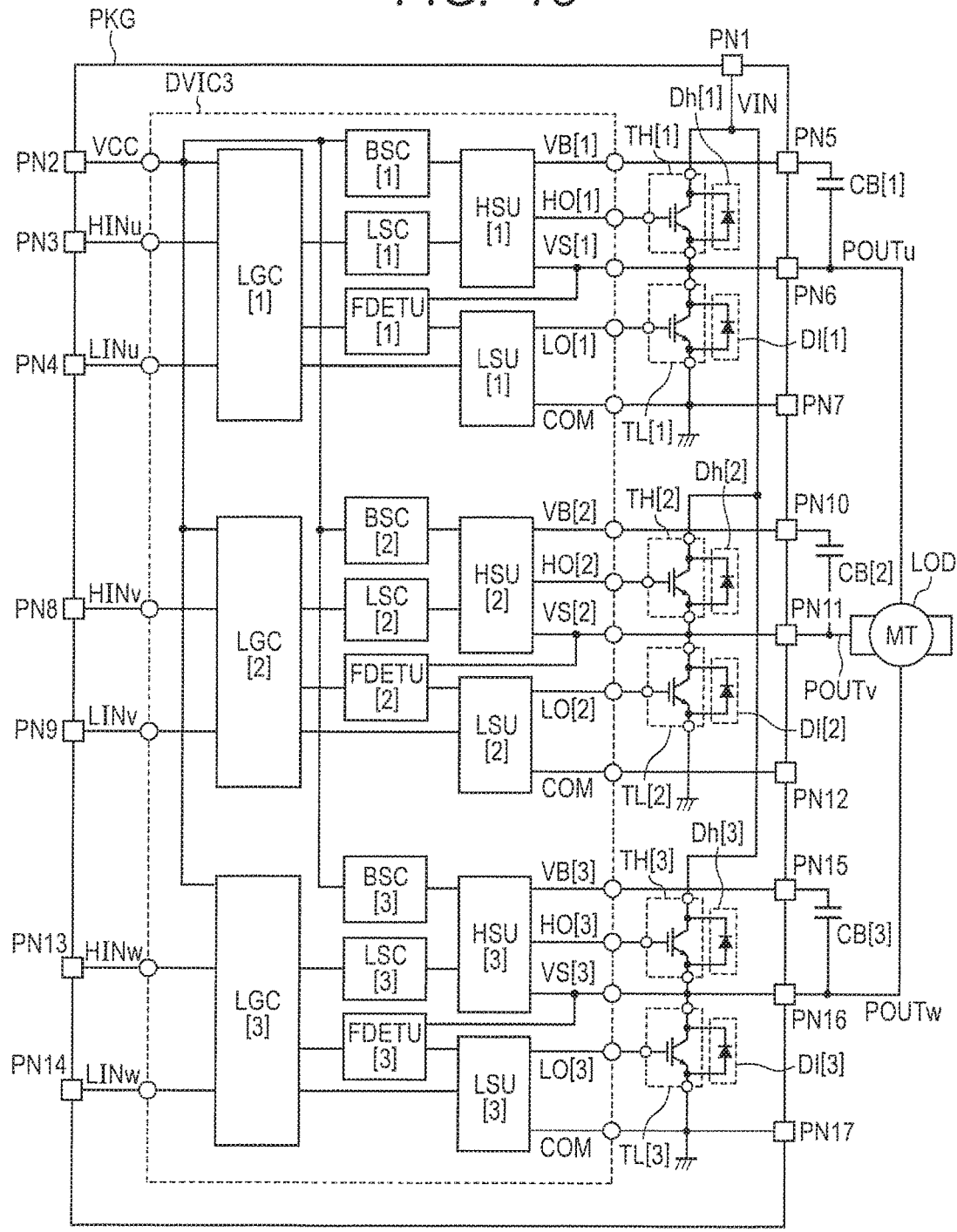
FIG. 15 is a circuit block diagram, in an electric power control apparatus according to a fourth embodiment of the present invention, illustrating one rough configurational example of an electronic system including the electric power control apparatus.

FIG. 15 is a circuit block diagram, in an electric power control apparatus according to the fourth embodiment of the present invention, illustrating one rough configurational example of an electronic system including the electric power control apparatus. The electronic system (for example, a three-phase inverter system) illustrated in FIG. 15 includes an electric power control apparatus PKG that is configured by one package, three bootstrap capacitors CB[1] to CB[3] that are components to be externally attached to the electric power control apparatus PKG, the load circuit LOD and so forth. Although there is no particular limit, the load circuit LOD is, for example, a motor MT and so forth to be used in an inverter air conditioner. The motor MT is driven by a three-phase bridge inverter using an external power supply voltage of at least about 150 V such as, for example, about 600 V.

The electric power control apparatus PKG includes a plurality of external pins PN1 to PN17. In addition, the electric power control apparatus PKG includes a driver IC (a semiconductor device) DVIC3, three high side transistors TH[1] to TH[3], three low side transistors TL[1] to TL[3], three high side reflux diodes Dh[1] to Dh[3], three low side reflux diodes Dl[1] to Dl[3] and so forth in the package. The transistors (TH[1] to TH[3] and TL[1] to Tl[3]) each is, for example, the IGBT and so forth. The diodes (Dh[1] to Dh[3] and Dl[1] to Dl[3]) each is, for example, an FRD (Fast Recovery Diode) and so forth.

The external pin PN1 is coupled to the input power supply voltage VIN source of several hundred V (for example, about 600 V). The external pin PN2 is coupled to the power supply voltage VCC source of, for example, about 15 V. A U-phase high side input signal HINu in input signals of three phases (U, V and W) is input into the external pin PN3 and a U-phase low side input signal LINu is input into the external pin PN4. The external pin PN5 is coupled to a boot power supply voltage VB[1] source. The external pin PN6 is coupled to a floating voltage VS[1] source. In addition, the external pin PN6 is also coupled to the load circuit LOD and outputs a U-phase load drive signal POUTu to the load circuit LOD. The external pin PN7 is coupled to the reference voltage COM source.

The external pins PN8 to PN12 are V-phase oriented external pins that respectively correspond to the U-phase oriented external pins PN3 to PN6. Likewise, the external pins PN13 to PN17 are W-phase oriented external pins that respectively correspond to the U-phase oriented external pins PN3 to PN6. Incidentally, the external pin PN1 and the external pin PN2 are commonly used in the U-phase, the V-phase, and the W-phase.

Briefly describing, V-phase high side and low side input signals HINV and LINv are respectively input into the external pins PNB and PN9 and the external pins PN10 and PN12 are respectively coupled to a boot power supply voltage VB[2] source and the reference voltage COM source. The external pin PN11 is coupled to a floating voltage VS[2] source and outputs a V-phase load drive signal POUTv to the load circuit LOD.

Likewise, W-phase high side and low side input signals HINw and LINw are respectively input into the external pins PN13 and PN14 and the external pins PN15 and PN17 are respectively coupled to a boot power supply voltage VB[3] source and the reference voltage COM source. The external pin PN16 is coupled to a floating voltage VS[3] source and outputs a W-phase load drive signal POUTw to the load circuit LOD.

The bootstrap capacitor CB[1] is arranged between the external pin PNS and the external pin (the load drive terminal) PN6. The bootstrap capacitor CB[2] is arranged between the external pin PN10 and the external pin (the load drive terminal) PN11. The bootstrap capacitor CB[3] is arranged between the external pin PN15 and the external pin (the load drive terminal) PN16.

The high side transistor TH[1] and the high side reflux diode Dh[1] configure a U-phase oriented high side arm and is arranged between the external pin PM and the external pin (the load drive terminal) PN6. The low side transistor TL[1] and the low side reflux diode Dl[1] configure a U-phase oriented low side arm and is arranged between the external pin (the load drive terminal) PN6 and the external pin PN7.

The high side transistor TH[2] and the high side reflux diode Dh[2] configure a V-phase oriented high side armand is arranged between the external pin PN1 and the external pin (the load drive terminal) PN11. The low side transistor TL[2] and the low side reflux diode Dl[2] configure a V-phase oriented low side arm and is arranged between the external pin (the load drive terminal) PN11 and the external pin PN12.

The high side transistor TH[3] and the high side r flux diode Dh[3] configure a W-phase oriented high side arm and is arranged between the external pin PN1 and the external pin (the load drive taiminal) PN16. The low side transistor TL[3] and the low side reflux diode Dl[3] configure a N-phase oriented low side arm and is arranged between the external pin (the load drive terminal) PN16 and the external pin PN17.

The driver IC (the semiconductor device) DVIC3 is so configured as to include three each for the respective circuit blocks in the driver IC (DVIC1) illustrated in FIG. 1. That is, the driver IC (DVIC3) includes a high side drive unit HSU[1], a low side drive unit LSU[1], a level shift circuit LSC[1], an input signal processing unit LGC [1] , a fault detection unit FDETU[1], a bootstrap circuit BSC[1] and so forth as a U-phase oriented circuit block.

In addition, the driver IC (DVIC3) includes a high side drive unit HSU[2], a low side drive unit LSU[2], a level shift circuit LSC[2], an input signal processing unit LGC[2], a fault detection unit FDETU[2], a bootstrap circuit BSC[2] and so forth as a V-phase oriented circuit block. Likewise, the driver IC (DVIC3) includes a high side drive unit HSU[3], a low side drive unit LSU[3], a level shift circuit LSC[3], an input signal processing unit LGC[3], a fault detection unit FDETU[3], a bootstrap circuit BSC[3] and so forth as a W-phase oriented circuit block.

For example, in the U-phase oriented circuit block, the pads P2, P3, P4, P6, and P8 illustrated in FIG. 1 are respectively coupled to the external pins PN3, PN4, PN5, PN6, and PN7. The pad P5 illustrated in FIG. 1 is coupled to the gate of the high side transistor TH[1] and outputs a U-phase high side output signal HO[1]. The pad P7 illustrated in FIG. 1 is coupled. to the gate of the low side transistor TL[1] and outputs a U-phase low side output signal LO[1].

Also in the V-phase oriented and W-phase oriented circuit blocks, each pad is coupled to the corresponding external pin and to the gate of the corresponding transistor similarly. For example, in the V-phase oriented circuit block, the pad P5 is coupled to the gate of the high side transistor TH[2] and outputs a V-phase high side output signal HO[2]. The pad P7 is coupled to the gate of the low side transistor TL[2] and outputs a V-phase low side output signal LO[2].

Likewise, in the W-phase oriented circuit block, the pad P5 is coupled to the gate of the high side transistor TH[3] and outputs a W-phase high side output signal HO[3]. The pad P7 is coupled to the gate of the low side transistor TL[3] and outputs a W-phase low side output signal LO[3]. Incidentally, the pad P1 that is coupled to the power supply voltage VCC source illustrated in FIG. 1 is coupled to the external pin PN2 and is commonly used among the respective U-phase oriented, V-phase oriented and W-phase oriented circuit blocks in the driver IC(DVIC3).

(Rough Layout Configuration of the Driver IC (Application Example))

Figure 16:
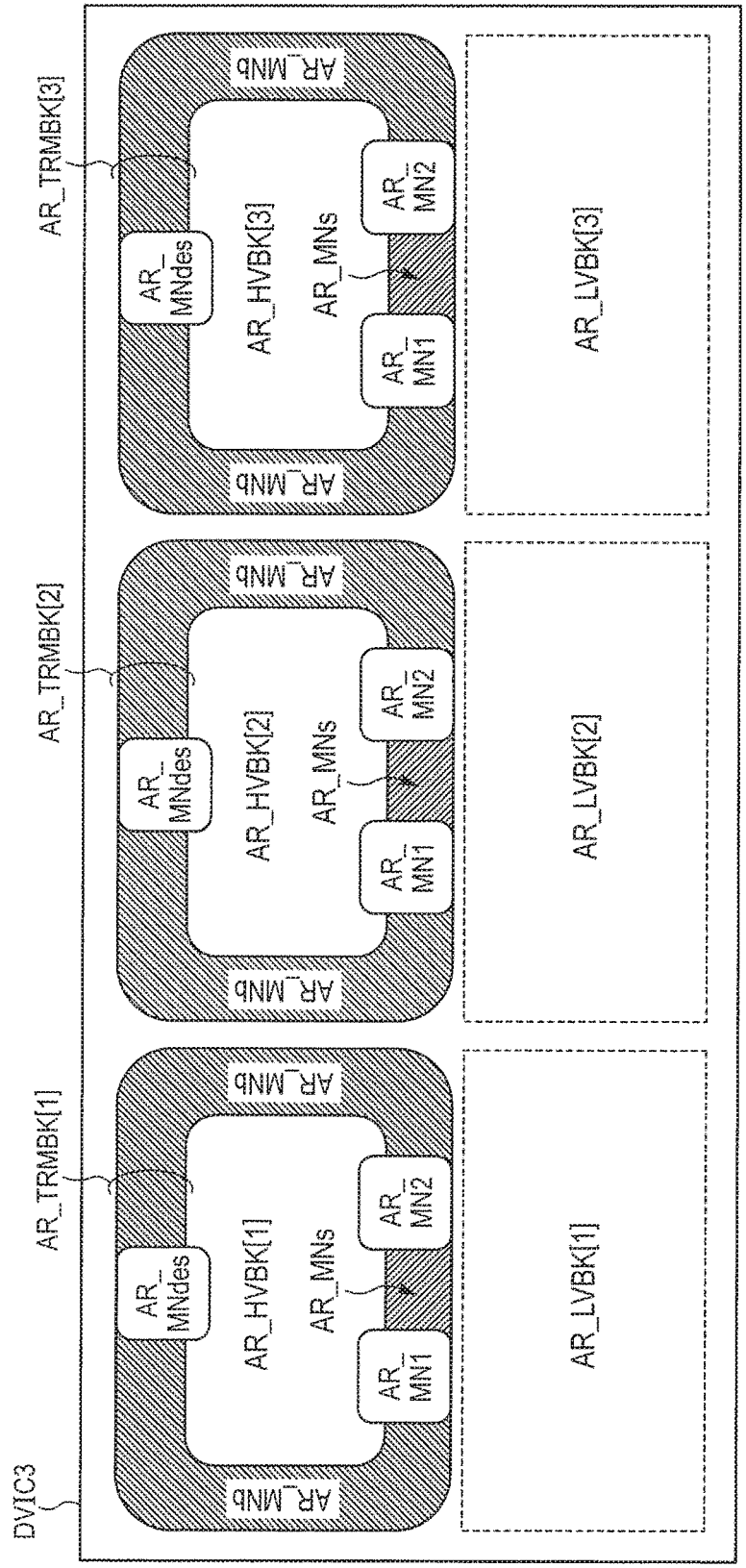
FIG. 16 is a plan view illustrating one rough configurational example of a layout of a driver IC in the electric power control apparatus in FIG. 15.

FIG. 16 is a plan view illustrating one rough configurational example of a layout of the driver IC in the electric power control apparatus in FIG. 15. The driver IC (the semiconductor device) DVIC3 illustrated in FIG. 16 is configured by one semiconductor chip and three each for the respective areas (the termination area AR_TRMBK, the low voltage area AR_LVBK and the high voltage area AR_HVBK) are arranged in the semiconductor chip. Although there is no particular limit, in the example in FIG. 16, the three termination areas AR_TRNBK illustrated in FIG. 12 are arranged side by side in a first direction and also the three low voltage areas AR_LVBK are arranged side by side in the first direction.

Each U-phase oriented circuit block that has been described with reference to FIG. 15 is formed in each of a termination area AR_TRMBK[1], a low voltage area AR_LVBK[1] and a high voltage area AR_HVBK[1]. Each V-phase oriented circuit block that has been described with reference to FIG. 15 is formed in each of a termination area AR_TRMBK[2], a low voltage area AR_LVBK [2] and a high voltage area AR_HVBK[2]. Each W-phase oriented circuit block that has been described with reference to FIG. 15 is formed in each of a termination area AR_TRMBK[3], a low voltage area AR_LVBK[3] and a high voltage area AR_HVBK[3].

(Rough Package Configuration of the Electric Power Control Apparatus)

Figure 17:
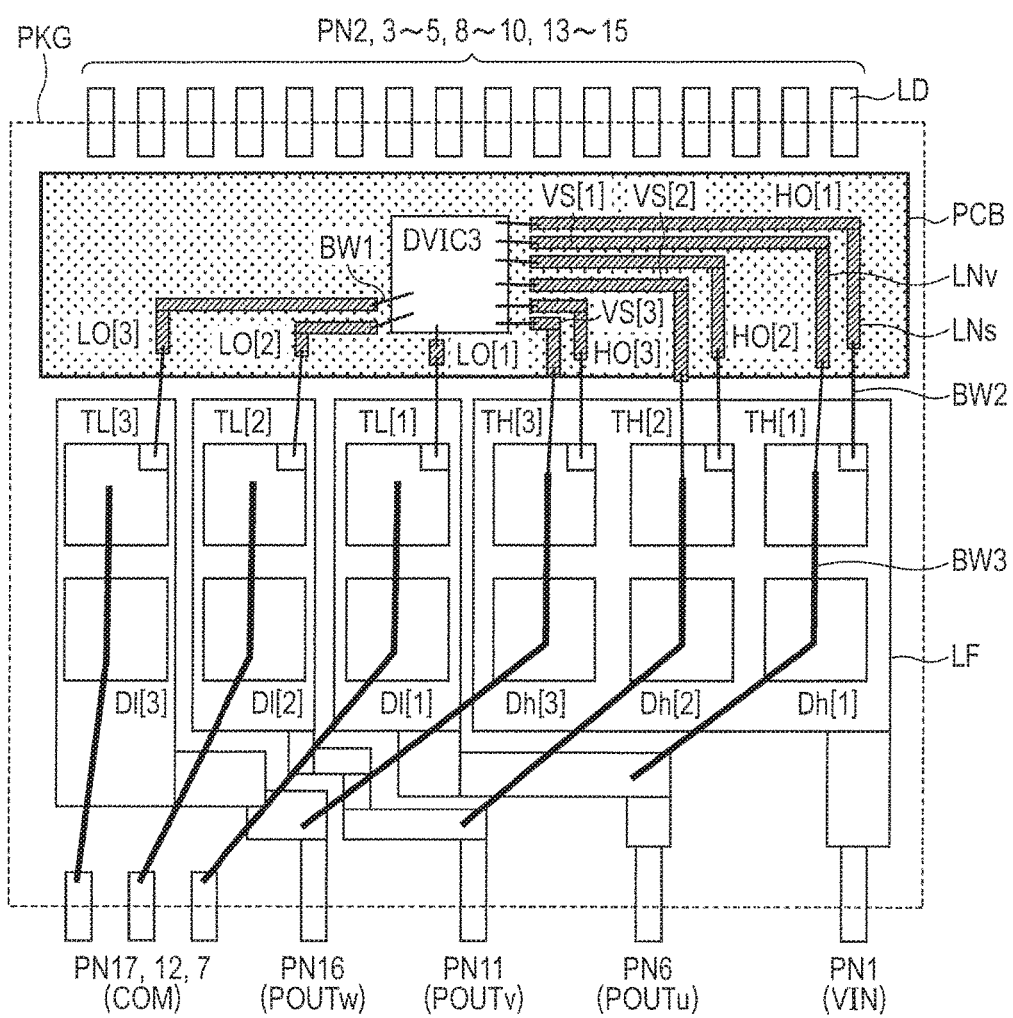
FIG. 17 is a plan view illustrating one rough configurational example of a package of the electric power control apparatus in FIG. 15.

FIG. 17 is a plan view illustrating one rough configurational example of the package of the electric power control apparatus in FIG. 15. The electric power control apparatus PKG illustrated in FIG. 17 has a configuration that a wiring substrate PCB such as, for example, a glass epoxy substrate and so forth, a lead frame LF, a plurality of leads LD that respectively correspond to the external pins PN1 to PN17 illustrated in FIG. 15 and so forth are included and these elements are sealed with a sealing material such as epoxy resin and so forth.

The driver IC (the semiconductor device) DVIC3 is mounted on the wiring substrate PCB. In the example in FIG. 17, the four (designated by LF1 to LF4) lead frames LF are provided. The lead frame LF1 is integrated with the external pin PN1 to be coupled to the input power supply voltage VIN source. The three high side transistors TH[1] to TH[3] and the three high side reflux diodes Dh[1] to Dh[3] are mounted on the lead frame LF1.

The lead frame LF2 is integrated with the external pin PN6 (the lead LD) that outputs the U-phase load drive signal POUTu. The low side trans TL[1] and the low side reflux diode [1] are mounted on the lead frame LF2. The lead frame LF3 is integrated with the external pin PN11 (the lead LD) that outputs the V-phase load drive signal POUTv. The low side transistor TL[2] and the low side reflux diode Dl[2] are mounted on the lead frame LF3. The lead frame LF4 is integrated with the external pin PN16 (the lead LD) that outputs the W-phase load drive signal POUTw. The low side transistor TL[3] and the low side reflux diode Dl[3] are mounted on the lead frame LF4.

The three high side transistors TH[1] to TH[3] and the three low side transistors TL[1] to TL[3] each has a vertical device structure that a mounting surface (that is, a back surface) onto the lead frame LF is used as a collector electrode and an emitter electrode and. a gate electrode are arranged on a front surface. In addition, the three high side reflux diodes Dh[1] to Dh[3] and the three low side reflux diodes Dl[1] to Dl[3] each has a vertical device structure that a mounting surface (that is, a back surface) onto the lead frame LF is used as a cathode electrode and an anode electrode is arranged on a front surface.

The emitter electrode of the high side transistor TH[1], the anode electrode of the high side reflux diode Dh[1], and the external pin PN6 are coupled together by a bonding wire BW3. In addition, the emitter electrode of the high side transistor TH[2], the anode electrode of the high side reflux diode Dh[2], and the external pin PN11 are coupled together by the bonding wire BW3. Likewise, the emitter electrode of the high side transistor TH[3], the anode electrode of the high side reflux diode Dh[3], and tte external pin PN16 are coupled together by the bonding wire BW3.

In addition, the emitter electrode of the low side transistor TL[1], the anode electrode of the low side reflux diode Dl[1], and the external pin PN7 to be coupled to the reference voltage COM source are coupled together by the bonding wire BW3. Likewise, the emitter electrode of the low side transistor TL[2], the anode electrode of the low side reflux diode Dl[2], and the external pin PN12 to be coupled to the reference voltage COM are are coupled together by the bonding wire BW3. The emitter electrode of the low side transistor TL[3], the anode electrode of the low side reflux diode Dl[3], and the external pin PN17 to be coupled to the reference voltage COM source are coupled together by the bonding wire BW3.

On the other hand, six signal wirings LNs for transmitting the U-phase, V-phase and W-phase high side output signals HO[1] to HO[3] and low side output signals LO[1] to LO[3] and three power supply wirings LNv for transmitting floating voltages VS[1] to VS[3] are respectively formed on the wiring substrate PCB. The three pads (the pads P5 in FIG. 1) for outputting the high side output signals HO[1] to HO[3] and the three pads (the pads P7 in FIG. 1) for outputting the low side output signals LO[1] to LO[3] are arranged on the front surface of the driver IC (DVIC3). The six pads concerned each is coupled to one end of each of the six signal wirings LNs via a bonding wire BW1. In addition, the other ends of the six signal wirings LNs each is coupled to the gate electrode of each of the three high side transistors TH[1] to TH[3] and three low side transistors TL[1] to TL[3].

Further, the emitter electrodes of the high side transistors TH[1] to TH[3] each is also coupled to the wiring substrate PCB via a bonding wire BW2. Then, the emitter electrodes of the high side transistors TH[1] to TH[3] each is coupled to each of the pads P6 for the respective phases (that is, VS[1], VS[2] and VS[3] in FIG. 15) of the driver IC (the DVIC3) via each of the three power supply wirings LNv and the bonding wire BW1 on the wiring substrate PCB.

In addition, although illustration is omitted, other pads that are arranged on the front surface of the driver IC (DVIC3) are respectively coupled to other corresponding external pins (PN2, 3 to 5, 8 to 10, and 13 to 15) that the electric power control apparatus PKG includes respectively via the bonding wires and the wirings on the wiring substrate PCB or directly by the bonding wires. It becomes possible to easily ensure, for example, an arrangement space for the bonding wires and so forth by using the wiring substrate PCB in this way.

As described above, it becomes possible to implement further miniaturization, cost reduction and so forth of the electric power control apparatus and the electronic system that includes the electric power control apparatus, in addition to the various advantageous effects described in the first to third embodiments and so forth by using the driver IC (the semiconductor device) DVIC3 and the electric power control apparatus PGK according to the fourth embodiment. Specifically describing, for example, when the diode for fault detection (Ddes in FIG. 18B) and the bootstrap diode are to be used as in the related art, it is conceivable to mount the diodes concerned on the wiring substrate PCB in FIG. 17.

However, in this case, it is feared that the area to be allocated to the wirings on the wiring substrate PCB as described above may be reduced, the degree of freedom of wiring may be reduced and thereby it may become difficult to ensure the arrangement space for the bonding wires. Further, it is also feared that mounting of the diodes concerned may cause an increase in cost of the electric power control apparatus and the electronic system. Such a disadvantage becomes more noticeable with increasing the number of the high side transistors and the number of the low side transistors (six in the example in FIG. 15) to be controlled by the electric power control apparatus PKG.

On the other hand, when the system according to the fourth embodiment is used, the driver IC (the semiconductor device) DVIC3 has the functions equivalent to those of the fault detection diode (Ddes) and the bootstrap diode and therefore it is possible to improve the degree of freedom of wiring on the wiring substrate PCB and it is possible to implement cost reduction because the diodes are not mounted. Further, as described in the first to third embodiments, since it is possible to build the functions that are equivalent to those of the fault detection diode (Ddes) and the bootstrap diode into the driver IC (DVIC3) while suppressing an increase in circuit area, it is possible to reduce the chip size of the driver IC (DVIC3) and consequently it is possible to further improve the degree of freedom of wiring on the wiring substrate PCB.

Incidentally, in FIG. 15, description has been made by taking the semiconductor device that performs electric power control of the three-phase bridge inverter and the electric power control apparatus that includes the semiconductor device as the examples. The system of the present embodiment may be applied to, for example, a device for performing electric power control of one phase (that is, one pair of the high side and low side transistor in the three-phase bridge inverter, a device for performing electric power control of a single-phase bridge inverter that is configured by two pairs of the high side and low side transistors and so forth, not limited to the above. Also in the above mentioned cases, the same advantageous effects as the above are obtained. However, as described above, in the system of the present embodiment, more beneficial advantageous effects are obtained with increasing the number of the high side and low side transistor to be controlled by one semiconductor device and one electric power control apparatus.

Although in the foregoing, the invention that has been made by the inventors and others has been specifically described on the basis of the preferred embodiments of the present invention, the present invention is not limited to the above-mentioned embodiments and may be altered and modified in a variety of ways within a range not deviating from the gist of the present invention. For example, the above-mentioned, embodiments have been described in detail in order to describe the present invention so as to be easily understandable and are not necessarily limited to the embodiments possessing all of the configurations which have been described. In addition, it is possible to replace part of a configuration of a certain embodiment with a configuration of another embodiment, and it is also possible to add a configuration of another embodiment to a configuration of a certain embodiment. In addition, it is possible to perform addition—deletion—replacement of another configuration in regard to part of a configuration of each embodiment.

What is claimed is:

1. A semiconductor device that includes
a floating terminal to be coupled to a floating voltage source,
a termination area having a ring-like shape,
a first area that is provided outside the termination area and that a circuit configured to operate at a first power supply voltage on the basis of a reference voltage is formed,
a second area that is provided inside the termination area and that a circuit configured to operate at a second power supply voltage on the basis of the floating voltage is formed and
that is configured by one semiconductor chip, comprising:
a low side driver that is formed in the first area and drives a low side transistor that is provided outside the semiconductor device;
a high side driver that is formed in the second area and drives a high side transistor that is provided outside the semiconductor device;
a level shift circuit that converts a signal that has been generated in the first area and is based on the reference voltage into a signal that is based on the floating voltage and outputs the signal so converted to the second area;
s first transistor that is formed in the termination area, is arranged between the floating terminal and a first sense node, and is driven at the first power supply voltage; and
a fault detection circuit that is formed in the first area and detects presence of a fault when a voltage of the first sense node is higher than a first decision voltage that has been determined in advance in a period of time that the low side driver is driving the low side transistor into an ON state.

2. The semiconductor device according to claim 1, wherein the first transistor is a depletion type transistor.

3. The semiconductor device according to claim 1, wherein the fault detection circuit includes
a filter circuit that smooths out the voltage of the first sense node by using a resistor and a capacitor, and
a first comparator circuit that compares an output voltage of the filter circuit with the first decision voltage.

4. The semiconductor device according to claim 1, wherein the fault detection circuit further detects the presence of the fault when the voltage of the first sense node is lower than a second decision voltage that has been determined in advance in a period of time that the low side driver is driving the low side transistor into an OFF state and the high side driver is driving the high side transistor into the ON state respectively.

5. The semiconductor device according to claim 1, further comprising:
a first power supply terminal to be coupled to the first power supply voltage source;
a second power supply terminal to be coupled to the second power supply voltage source;
a second transistor that is formed in the termination area and is arranged between the first power supply terminal and the second power supply terminal;
a third transistor that is formed in the termination area, is arranged between the second power supply teLminal and a second sense node, and is driven at the first power supply voltage; and
a second comparator circuit that is formed in the first area, drives the second transistor into the ON state when a voltage of the second sense node is lower than the first power supply voltage, and drives the second transistor into an OFF state when the voltage of the second sense node is higher than the first power supply voltage,
wherein the second transistor charges a capacitor that is arranged between the second power supply terminal and the floating terminal outside the semiconductor device, and
wherein the third transistor is a depletion type transistor.

6. The semiconductor device according to claim 5, wherein the level shift circuit includes a fourth transistor and a fifth transistor fol,hed in the teruination area,
wherein the termination area includes three sections obtained by almost equally dividing the ring into three parts in all orbiting direction of the ring with a gate width of each transistor being set in the orbiting direction of the ring, and
wherein the first transistor, the fourth transistor and the fifth transistor are respectively formed in partial sections in the mutually different sections in the three sections.

7. The semiconductor device according to claim 6, wherein the fourth transistor and the fifth transistor are arranged at a first interval in the orbiting direction of the ring, wherein the first transistor and the fourth transistor are arranged at a second interval that is larger than the first interval in the orbiting direction of the ring, wherein the first transistor and the fifth transistor are arranged at a third interval that is equivalent to the second interval in the orbiting direction of the ring, wherein the second transistor is arranged in each of an area corresponding to the second interval and an area corresponding to the third interval, and wherein the third transistor is arranged in an area corresponding to the first interval.

8. An electric power control apparatus, comprising:
a reference tel.Lainal to be coupled to a reference voltage source;
a first power supply terminal to be coupled to a first power supply voltage source;
a second power supply terminal to be coupled to a second power supply voltage source;
a third power supply terminal to be coupled to a third power supply voltage source having a voltage value that is higher than that of the first power supply voltage;
a load drive terminal;
a high side transistor that is arranged between the third power supply terminal and the load drive terminal;
a low side transistor that is arranged between the load drive terminal and the reference terminal; and
a semiconductor chip that drives the high side transistor and the low side transistor, and
configured by one package
wherein the semiconductor chip includes
a termination area having a ring-like shape,
a first area that is provided outside the termination area and that a circuit configured to operate at the first power supply voltage on the basis of the reference voltage is formed,
second area that is provided inside the termination area and that a circuit configured to operate at the second power supply voltage on the basis of a voltage of the load drive terminal is formed, and
wherein the semiconductor chip further includes
a low side driver that is formed in the first area and drives the low side transistor,
a high side driver that is foimed in the second area and drives the high side transistor,
a level shift circuit that converts a signal that has been generated in the first area and is based on the reference voltage into a signal that is based on the voltage of the load drive teLminal and outputs the signal so converted to the second area,
a first transistor that is formed in the termination area, is arranged between the load drive terminal and a first sense node, and is driven at the first power supply voltage, and
a fault detection circuit that is formed in the first area and detects presence of a fault when a voltage of the first sense node is higher than a first decision voltage that has been dete mined in advance in a period of time that the low side driver is driving the low side transistor into an ON state.

9. The electric power control apparatus according to claim 8,
wherein the first transistor is a depletion type transistor.

10. The electric power control apparatus according to claim 8,
wherein the fault detection circuit includes
a filter circuit that smooths out the voltage of the first sense node by using a resistor and a capacitor, and a first comparator circuit that compares an output voltage of the filter circuit with the first decision voltage.

11. The electric power control apparatus according to claim 8,
wherein the fault detection circuit further detects the presence of the fault when the voltage of the first sense node is lower than a second decision voltage that has been determined in advance in a period of time that the low side driver is driving the low side transistor into an OFF state and the high side driver is driving the high side transistor into the ON state.

12. The electric power control device according to claim 8, further comprising:
a second transistor that is formed in the termination area and is arranged between the first power supply terminal and the second power supply terminal,
a third transistor that is formed in the termination area, is arranged between the second power supply terminal and a second sense node, and is driven at the first power supply voltage, and
a second comparator circuit that is formed in the first area, drives the second transistor into the ON state when the voltage of the second sense node is lower than the first power supply voltage, and drives the second transistor into an OFF state when a voltage of the second sense node is higher than the first power supply voltage,
wherein the second transistor charges a capacitor that is arranged between the second power supply terminal and the lead drive terminal outside the electric power control apparatus, and
wherein the third transistor is a depletion type transistor.

13. The electric power control apparatus according to claim 12,
wherein the level shift circuit includes a fourth transistor and a fifth transistor formed in the termination area,
wherein the termination area includes three sections obtained by almost equally dividing the ring into three parts in an orbiting direction of the ring with a gate width of each transistor being set in the orbiting direction of the ring, and
wherein the first transistor, the fourth transistor and the fifth. transistor are respectively formed in partial sections in the mutually different sections in the three sections.

14. The electric power control apparatus according to claim 13,
wherein the fourth transistor and the fifth transistor are arranged at a first interval in the orbiting direction of the ring,
wherein the first transistor and the fourth transistor are arranged at a second interval that is larger than the first interval in the orbiting direction of the ring,
wherein the first transistor and the fifth transistor are arranged. at a third interval that is equivalent to the second interval in the orbiting direction of the ring,
wherein the second transistor is arranged in each of an area corresponding to the second interval and an area corresponding to the third interval, and
wherein the third transistor is arranged in an area corresponding to the first interval.

15. The electric power control apparatus according to claim 8,
wherein the electric power control apparatus includes three each for the second power supply terminal, the load drive terminal, the high side transistor and the low side transistor, wherein each of the three high side transistors is arranged between the third power supply terminal and each of the three load drive terminals, wherein each of the three low side transistors is arranged between each of the three load drive terminals and the reference terminal, and wherein the semiconductor chip includes three each for the termination region, the first area and the second area.

16. The electric power control apparatus according to claim 15, further comprising:

a wiring substrate on which the semiconductor chip is to be mounted; and a bonding wire that couples the wiring substrate with each of the three high side transistors and each of the three low side transistors.

17. The electric power control apparatus according to claim 16, wherein the three high side transistors and the three low side transistors each is an IGBT.

* * * * *

UNITED STATES PATENT AND TRADEMARK OFFICE
CERTIFICATE OF CORRECTION

PATENT NO. : 9,621,151 B2
APPLICATION NO. : 15/157040
DATED : April 11, 2017
INVENTOR(S) : Ryo Kanda et al.

It is certified that error appears in the above-identified patent and that said Letters Patent is hereby corrected as shown below:

Please correct the current Abstract with the replacement Abstract below:

(57) ABSTRACT

A driver IC includes a ring-shaped termination area, and a first area and a second area that are respectively arranged outside and inside the termination area on a layout. A sense MOS that is arranged between a floating terminal and a first sense node and is driven at a power supply voltage is formed in the termination area. A fault detection circuit that detects presence of a fault when a voltage of the first sense node is higher than a decision voltage that has been determined in advance in a period of time that a low side driver is driving a low side transistor into an ON state is formed in the first area.

Signed and Sealed this
Twenty-seventh Day of June, 2017

Joseph Matal
*Performing the Functions and Duties of the*
*Under Secretary of Commerce for Intellectual Property and*
*Director of the United States Patent and Trademark Office*